(12) United States Patent
Gentilhomme

(10) Patent No.: US 10,664,634 B2
(45) Date of Patent: May 26, 2020

(54) ENSEMBLE-BASED MULTI-SCALE HISTORY-MATCHING DEVICE AND METHOD FOR RESERVOIR CHARACTERIZATION

(71) Applicant: CGG SERVICES SAS, Massy (FR)

(72) Inventor: Theophile Gentilhomme, Renens (CH)

(73) Assignee: CGG SERVICES SAS, Massy (FR)

( * ) Notice: Subject to any disclaimer, the term of this patent is extended or adjusted under 35 U.S.C. 154(b) by 644 days.

(21) Appl. No.: 15/318,821

(22) PCT Filed: Jun. 25, 2015

(86) PCT No.: PCT/IB2015/001309
§ 371 (c)(1),
(2) Date: Dec. 14, 2016

(87) PCT Pub. No.: WO2016/001752
PCT Pub. Date: Jan. 7, 2016

(65) Prior Publication Data
US 2017/0140079 A1    May 18, 2017

Related U.S. Application Data

(60) Provisional application No. 62/018,764, filed on Jun. 30, 2014.

(51) Int. Cl.
*E21B 49/00* (2006.01)
*G06F 30/20* (2020.01)
(Continued)

(52) U.S. Cl.
CPC .............. *G06F 30/20* (2020.01); *E21B 41/00* (2013.01); *E21B 41/0092* (2013.01);
(Continued)

(58) Field of Classification Search
CPC ...... G06F 17/5009; G06F 17/18; G06F 17/11; E21B 41/0092; E21B 49/00; E21B 41/00; G01V 1/282
(Continued)

(56) References Cited

U.S. PATENT DOCUMENTS

2011/0273961 A1* 11/2011 Hu ................... G01V 1/282
367/47

OTHER PUBLICATIONS

Lu et al., A multiresolution approach to reservoir parameter estimation using wavelet analysis, 2000, SPE Annual Technical Conference and Exhibition, pp. 1-15.*
(Continued)

*Primary Examiner* — Juan C Ochoa
(74) *Attorney, Agent, or Firm* — Patent Portfolio Builders PLLC

(57) ABSTRACT

Device, medium and method for generating a multidimensional image of a subsurface of the earth. The method includes receiving data related to the subsurface of the earth; generating an ensemble of realizations associated with the subsurface based on the received data; applying wavelet re-parameterization to spatial properties of the members of the ensemble to calculate a set of wavelet coefficients; reconstructing the spatial properties of the ensemble based on a subset of the wavelet coefficients; applying a forward simulator to the reconstructed spatial properties of the ensemble for estimating one or more physical parameters of the subsurface; applying an ensemble-based optimization method to update the subset of the wavelet coefficients; and generating multidimensional image of the subsurface based on the updated subset of the wavelet coefficients.

16 Claims, 16 Drawing Sheets

(51) Int. Cl.
  E21B 41/00 (2006.01)
  G01V 1/28 (2006.01)
  G06F 17/11 (2006.01)
  G06F 17/18 (2006.01)
(52) U.S. Cl.
  CPC .............. *E21B 49/00* (2013.01); *G01V 1/282* (2013.01); *G06F 17/11* (2013.01); *G06F 17/18* (2013.01)
(58) Field of Classification Search
  USPC ...................................................... 703/2, 10
  See application file for complete search history.

(56) References Cited

OTHER PUBLICATIONS

Chen & Oliver, Cross-covariances and localization for EnKF in multiphase flow data assimilation, 2010, Computational Geosciences, Springer Netherlands, pp. 579-601.*
H.B. Ameur et al., "Refinement and Coarsening Indicators for Adaptive Parameterization: Application to the Estimation of Hydraulic Transmissivities", Oct. 7, 2001, pp. 1-25.
J.L. Anderson, "Exploring the Need for Localization in Ensemble Data Assimilation Using a Hierarchical Ensemble Filter" Physica D: Nonlinear Phenom, Jul. 31, 2006, 230(1-2), pp. 99-111.
E. Bhark et al., "A Multiscale Workflow for History Matching in Structured and Unstructured Grid Geometries", SPE Journal, Sep. 2012, pp. 828-848.
E. Bhark et al., "An Adaptively Scaled Frequency-domain Parameterization for History Matching", Journal of Petroleum Science and Engineering, 2011, 75, pp. 289-303.
C.S. Burrus et al., "Introduction to Wavelets and Wavelet Transforms: A Primer", Prentice-Hall, Inc., Simon & Schuster, 1998, pp. 1-268.
D.L. Donoho, "Compressed Sensing", Department of Statistics, Stanford University, Sep. 14, 2004, pp. 1-34.
Y. Efendiev et al., "Preconditioning Markov Chain Monte Carlo Simulations Using Coarse-scale Models", 2006, pp. 1-27.
G. Evensen, "The Ensemble Kalman Filter: Theoretical Formulation and Practical Implementation", 2003, pp. 1-29.
R. Furrer et al., "Estimation of High-dimensional Prior and Posterior Covariance Matrices in Kalman Filter Variants", 2007, pp. 1-32.
G.H. Golub et al., "Matrix Computations", Third Edition, The Johns Hopkins University Press, 1996, pp. 1-694.
Y. Gu et al., "An Iterative Ensemble Kalman Filter for Multiphase Fluid Flow Data Assimilation", Society of Petroleum Engineers, 2007, 12(4), pp. 438-446.
G. Gao et al., "Quantifying Uncertainty for the PUNQ-S3 Problem in a Bayesian Setting With RML and EnKF", Society of Petroleum Engineers, Inc., 2006, 11(4), pp. 506-515.
T.M Hamill et al., "Distance-dependent Filtering of Background Error Covariance Estimates in an Ensemble Kalman Filter", 2001.
M.A. Iglesias et al., "The Regularizing Levenberg-Marquardt Scheme for History Matching of Petroleum Reservoirs", Comput Geosci, 2013, 17, pp. 1033-1053.
L. Li et al., "A Sparse Bayesian Estimation Framework for Conditioning Prior Geologic Models to Nonlinear Flow Measurements", Department of Petroleum, Texas A&M University, 2010.
S.G. Mallat, "A Theory for Multiresolution Signal Decomposition: The Wavelt Representation", IEEE Transactions on Pattern Analysis and Machine Intelligence, Jul. 1989, vol. 11, No. 7, pp. 674-693.
D. S. Oliver et al., "Inverse Theory for Petroleum Reservoir Characterization and History Matching", Cambridge University Press, 2008, pp. 1-380.
R. Soubaras et al., "Variable-depth Streamer—A Broadband Marine Solution", EAGE, first break, Dec. 2010, vol. 28, pp. 89-96.
W. Sweldens et al., "Building Your Own Wavelets at Home", 2000, pp. 1-30.
W. Sweldens, "The Lifting Scheme: A Construction of Second Generation Wavelets", May 1995, Revised Nov. 1996, To appear in SIAM Journal on Mathematical Analysis, pp. 1-42.
M. Girardi et al., "A New Class of Unbalanced HAAR Wavelets that Form an Unconditional Basis for Lp on General Measure Spaces", 1997, pp. 1-32.
A. Grossman et al., "Decomposition of Hardy Functions Into Square Integrable Wavelets of Constant Shape", Centre de Physique Theorique, Sep. 1982, pp. 1-31 (see specification, p. 50).
Eric W. Bhark et al., "A generalized grid connectivity-based parameterization for subsurface flow model calibration", Water Resources Research, 2011, pp. 1-32, vol. 47 (see specification, p. 50).
Hend Ben Ameur et al., "The Multidimensional Refinement Indicators Algorithm for Optimal Parameterization", Institut National de Recherche en Informatique et en Automatique, Jun. 2006, pp. 1-16 (see specification, p. 49).
P.L. Houtekamer et al., "A Sequential Ensemble Kalman Filter for Atmospheric Data Assimilation", Monthly Weather Review, Jan. 2001, pp. 123-137, vol. 129 (see specification, p. 50).
Yan Chen et al., "Multiscale parameterization with adaptive regularization for improved assimilation of nonlocal observation", Water Resources Research, 2012, pp. 1-15, vol. 48 (see specification, p. 48).
International Search Report in related International Application No. PCT/IB2015/001309, dated Dec. 21, 2015.
Written Opinion of the International Searching Authority in related International Application No. PCT/IB2015/001309, dated Dec. 21, 2015.
T. Gentilhomme et al., "Adaptive Multi-Scale Ensemble-Based History Matching of Siesmic-Derived Models", Thirteenth International Congress of the Brazilian Geophysical Society, Rio De Janeiro, Brazil, Aug. 26-29, 2013, pp. 1-6.
T. Gentilhomme et al., "Smooth Multi-Scale Parameterization for Integration of Seismic and Production Data Using Second-Generation Wavelets", ECMOR XIII—13th European Conference on the Mathematics of Oil Recovery, Biarritz, France, Sep. 10-13, 2012.

* cited by examiner

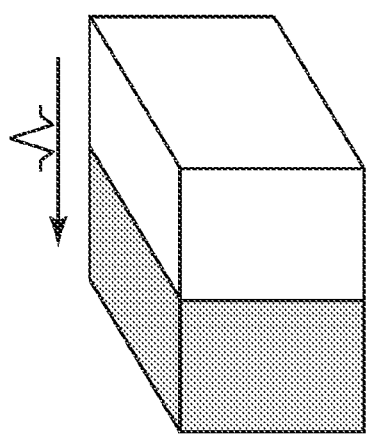
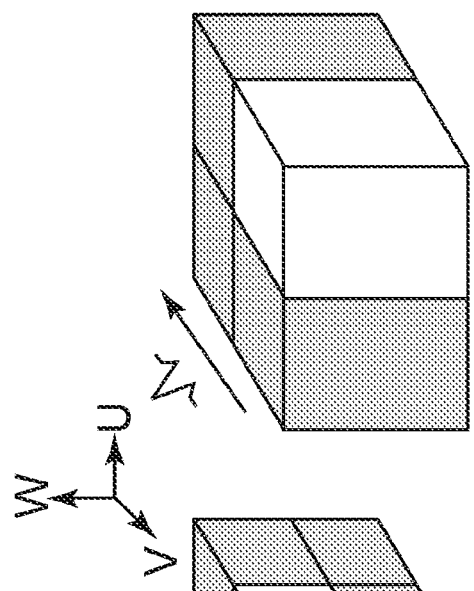
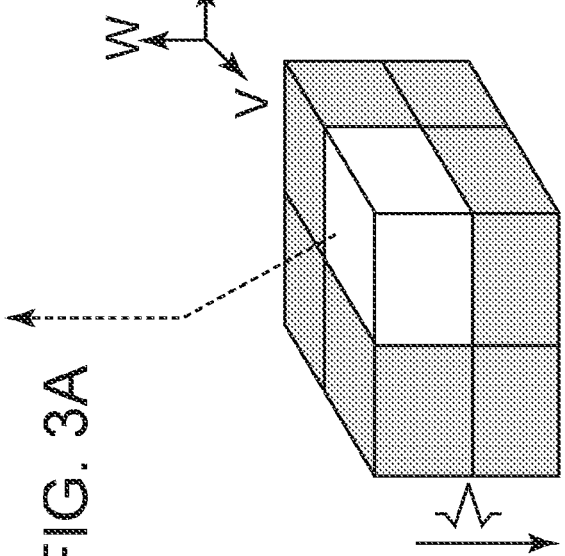
FIG. 3A  FIG. 3B  FIG. 3C  FIG. 3D
☐ Scaling coefficients
▨ Wavelet coefficients Original image Initial smoothed image

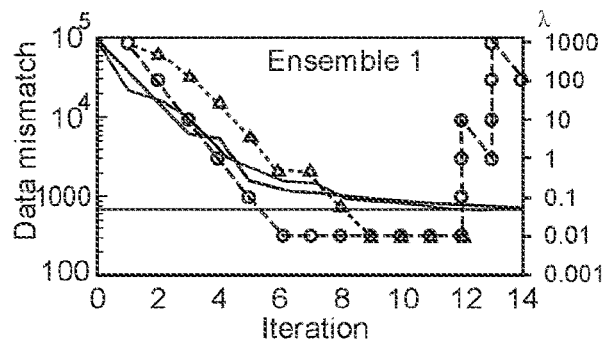
FIG. 9A
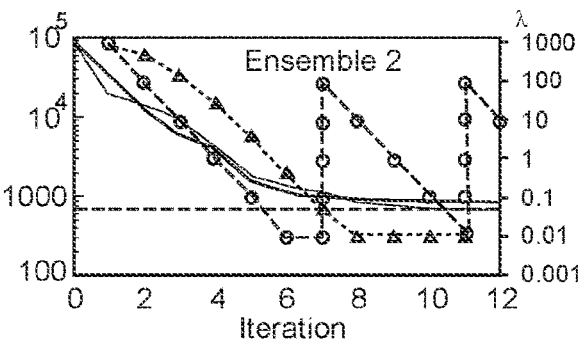
FIG. 9B
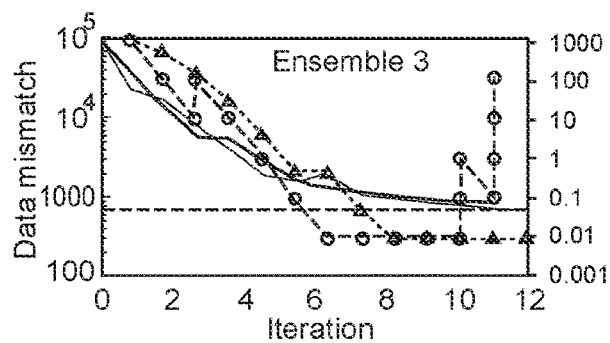
FIG. 9C
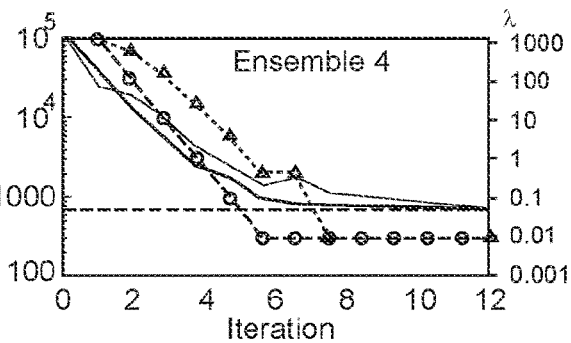
FIG. 9D
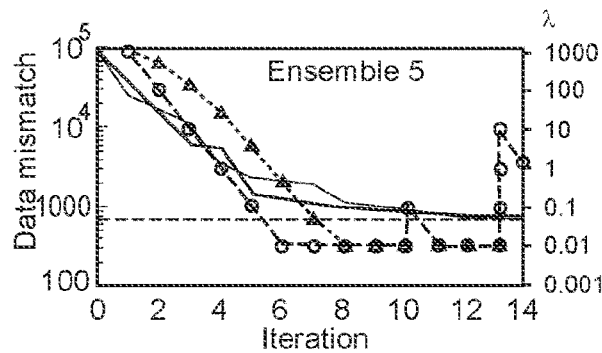
FIG. 9E
FIG. 9F
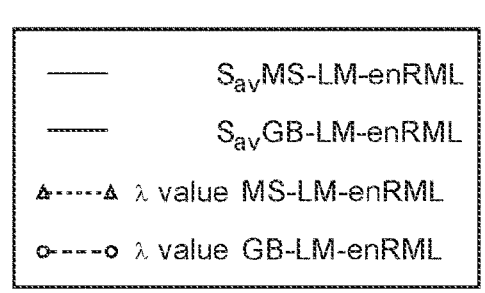

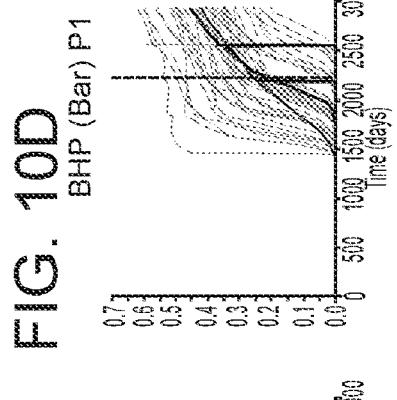
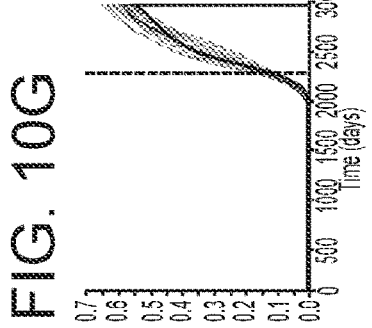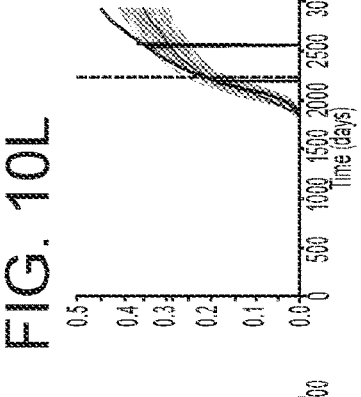
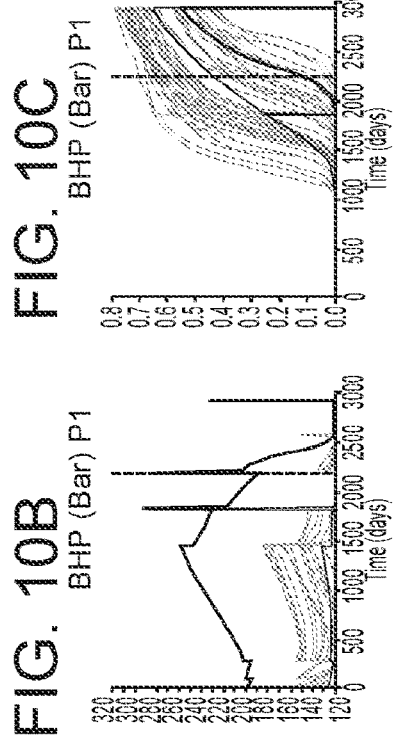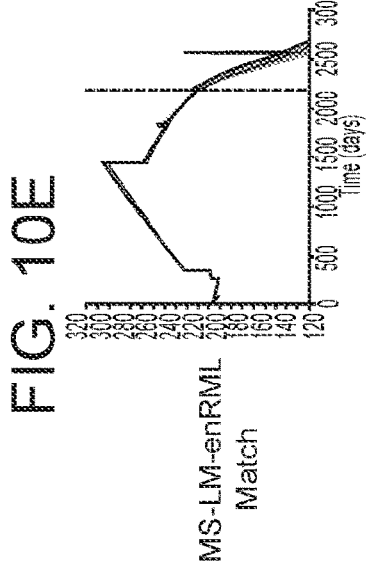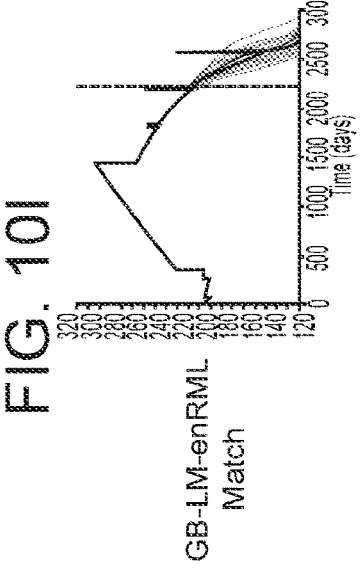
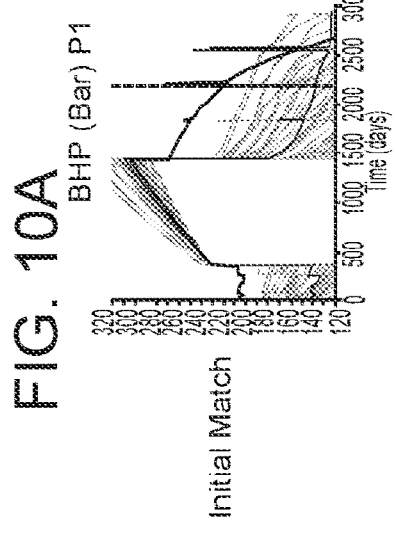
FIG. 10A  FIG. 10B  FIG. 10C  FIG. 10D
FIG. 10E  FIG. 10F  FIG. 10G  FIG. 10H
FIG. 10I  FIG. 10J  FIG. 10K  FIG. 10L
Initial Match
MS-LM-enRML Match
GB-LM-enRML Match Reference 4    4.2    4.4    4.6    4.8    5        Prior Log-permeability MS-LM-enRML GB-LM-enRML

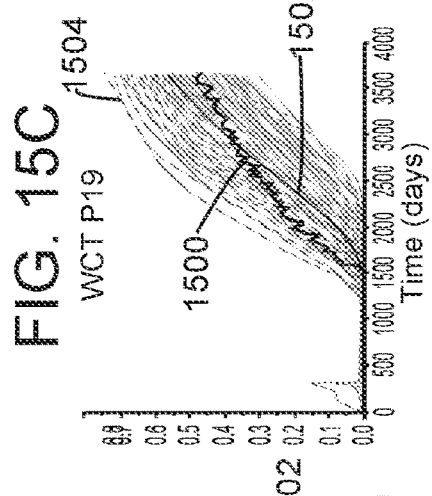
FIG. 15A
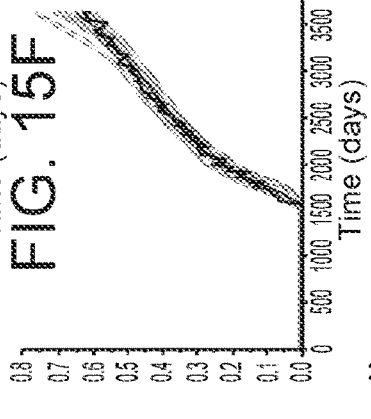
FIG. 15B
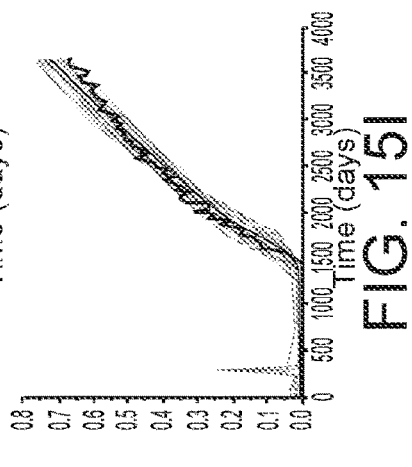
FIG. 15C
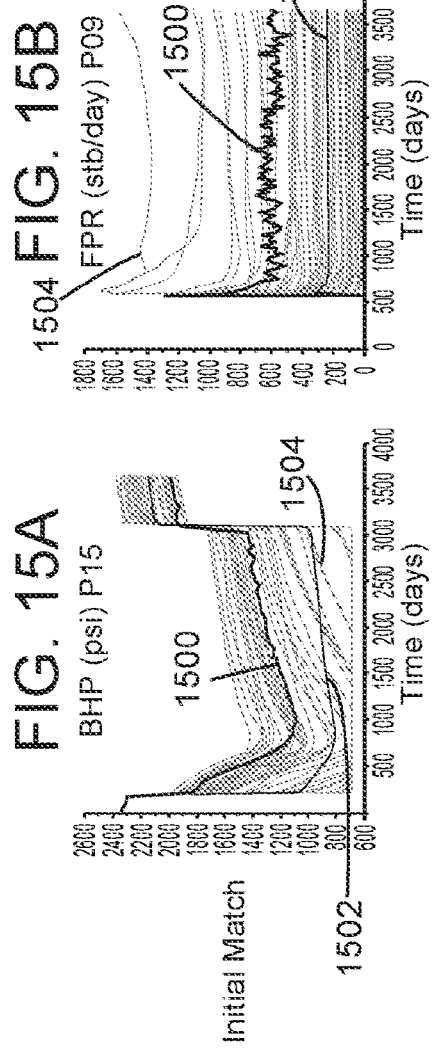
FIG. 15D / FIG. 15G
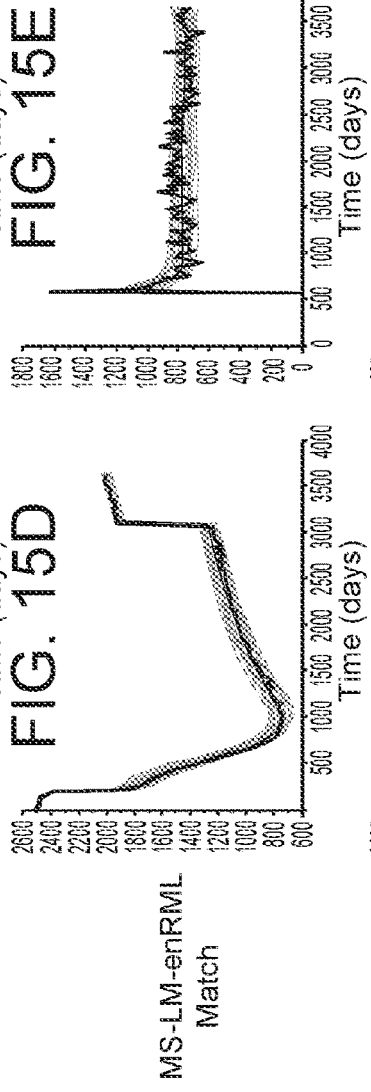
FIG. 15E / FIG. 15H
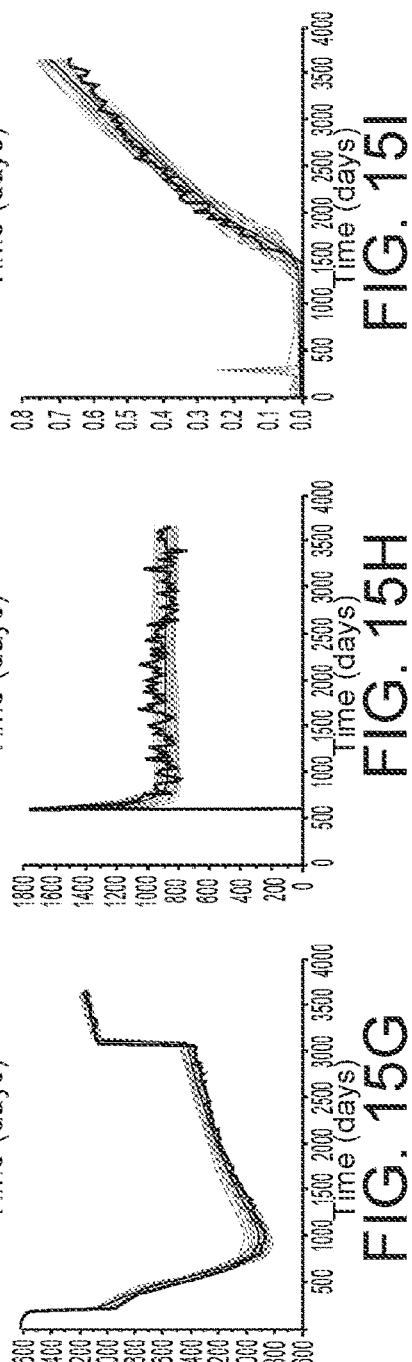
FIG. 15F / FIG. 15I

ENSEMBLE-BASED MULTI-SCALE HISTORY-MATCHING DEVICE AND METHOD FOR RESERVOIR CHARACTERIZATION

CROSS REFERENCE TO RELATED APPLICATIONS

The present application claims the benefit of priority under 35 U.S.C. § 119(e) to U.S. Provisional Application No. 62/018,764 filed on Jun. 30, 2014, entitled "Multi-scale reservoir characterization using well production data," the entire contents of which is hereby incorporated by reference.

BACKGROUND

Technical Field

Embodiments of the subject matter disclosed herein generally relate to methods and systems for characterizing a subsurface and, more particularly, to mechanisms and techniques for processing data related to the subsurface for generating an ensemble of models that describe the subsurface, allow flow predictions to be made and/or generate uncertainty estimation.

Discussion of the Background

A forward model (e.g., reservoir simulation, geo-mechanical model) is a tool that gives insight into dynamic rock and fluid properties for evaluation of past reservoir performance, prediction of future reservoir performance, and reserve estimation. Reservoir simulation might be the only reliable method to predict performance of large complex reservoirs. Additionally, simulation results, when combined with 3-D time-lapse seismic results, form a reservoir-monitoring tool for mapping changes associated with production that can be used to understand past reservoir behavior for future prediction.

In standard geo-modeling workflows, integration of static and dynamic data is usually performed sequentially, as follows: (i) petrophysical geo-models are initially built using log data and geophysical data and (ii) the models are then perturbed to match historic production data (e.g., flow, saturation and other parameters that are measured at wells associated with the subsurface describing the reservoir). For this last step, ensemble-based methods of optimization [1-3] have become popular due to their flexibility, computational efficiency, and ability to match dynamic data using a wide range of parameters and quantify posterior uncertainties. A quadratic approximation of the objective function is statistically estimated from an ensemble of realizations and is used to update each individual member. However, for high dimensional problems, the size of the ensemble is limited as a full fluid flow simulation needs to be run for each member. For this reason, the resulting approximation may be noisy and leads to spurious updates which will damage important geological features of the prior models and significantly reduce the variability of the ensemble.

Thus, there is a need to develop a method capable of matching the production history of the reservoir, preserving the original models and also being able to accurately predict the future behavior of the reservoir.

SUMMARY OF THE INVENTION

According to an embodiment, there is a method for generating a multidimensional image of a subsurface of the earth. The method includes a step of receiving data related to the subsurface of the earth, a step of generating an ensemble of realizations associated with the subsurface based on the received data, a step of applying wavelet re-parameterization to spatial properties of the members of the ensemble to calculate a set of wavelet coefficients, a step of reconstructing the spatial properties of the ensemble based on a subset of the wavelet coefficients, a step of applying a forward simulator to the reconstructed spatial properties of the ensemble for estimating one or more physical parameters of the subsurface, a step of applying an ensemble-based optimization method to update the subset of the wavelet coefficients, and a step of generating multidimensional image of the subsurface based on the updated subset of the wavelet coefficients.

According to another embodiment, there is a computing device for generating a multidimensional image of a subsurface of the earth. The computing device includes an interface configured to receive data related to the subsurface of the earth, and a processor connected to the interface. The processor is configured to generate an ensemble of realizations associated with the subsurface based on the received data, apply wavelet re-parameterization to spatial properties of the members of the ensemble to calculate a set of wavelet coefficients, reconstruct the spatial properties of the ensemble based on a subset of the wavelet coefficients, apply a forward simulator to the reconstructed spatial properties of the ensemble for estimating one or more physical parameters of the subsurface, apply an ensemble-based optimization method to update the subset of the wavelet coefficients, and generate a multidimensional image of the subsurface based on the updated subset of the wavelet coefficients.

According to still another exemplary embodiment, there is a computer-readable medium including computer-executable instructions, wherein the instructions, when executed by a processor, implement instructions for generating a multidimensional image of a subsurface of the earth. The instructions implement the method steps discussed above.

BRIEF DESCRIPTION OF THE DRAWINGS

For a more complete understanding of the present invention, reference is now made to the following descriptions taken in conjunction with the accompanying drawings, in which:

FIG. 3A illustrates a 3D wavelet transform having scaling coefficients at resolution r, FIG. 3B illustrates the coefficients after wavelet decomposition along direction U, FIG. 3C illustrates the coefficients after wavelet decomposition along direction V and FIG. 3D illustrates the coefficients after wavelet decomposition along direction W;

FIGS. 9A-F show the ensemble average data mismatch (i.e., value of the objective function) for different ensembles and for different processing methods;

FIGS. 10A-L show the match and prediction to water cut and pressure at four wells for the entire ensemble before and after optimization for two different processing methods;

FIGS. 15A-1 show the match of the bottom-hole pressure, fluid production rate and water cut at three wells calculated with a novel method;

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to seismic data. However, the embodiments to be discussed next are not limited to this kind of data, but they may applied to other data related to the subsurface.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, it is proposed a multi-scale approach based on grid-adaptive second-generation wavelets for reservoir characterization. The wavelets can be applied on irregular reservoir grids of any dimensions containing dead or flat cells. The method starts by modifying a few low-frequency parameters (coarse scales) and then progressively allows more important updates on a limited number of sensitive parameters of higher resolution (fine scales). The Levenberg-Marquardt ensemble randomized maximum likelihood (LM-enRML) is used as one possible optimization method with a new space-frequency distance-based localization of the Kalman gain, specifically designed for the multi-scale scheme.

1. INTRODUCTION

Figure 1:
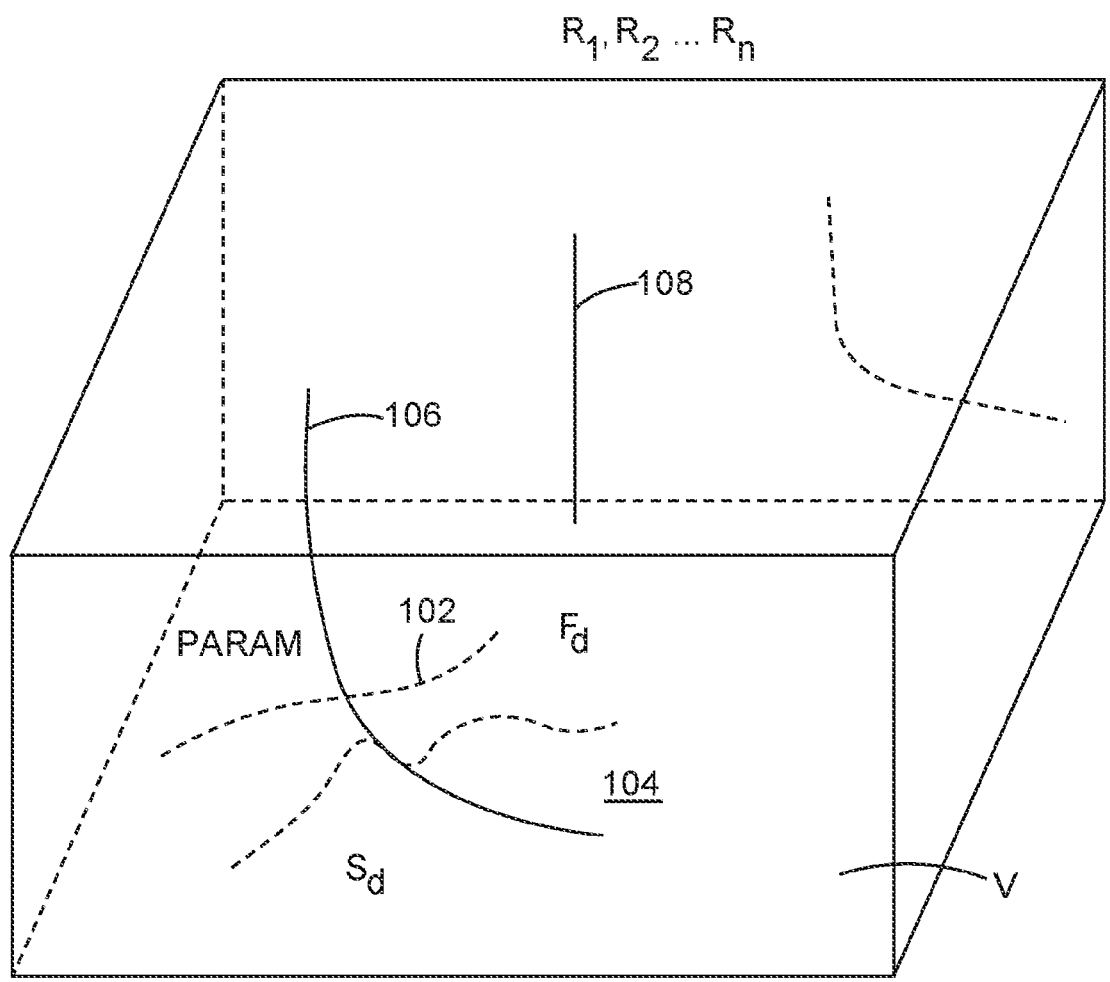
FIG. 1 illustrates a reservoir.

According to another embodiment illustrated in FIG. 1, a set of realizations $R_i$ (a realization is the output of a model that is construed to characterize a given volume V of the subsurface, or parameters associated with a forward model, which may be included from the beginning of the inversion process), which are generated from prior data (e.g., seismic data $S_d$, flow data $F_d$, etc.) and knowledge, are updated with production history and 4D seismic data using an efficient ensemble-based optimization method, while minimizing the perturbation of parameters and the addition of noise in order to maintain the variability of the ensemble and the consistency with all the available data used to constrain the initial realizations.

Low resolutions of property fields (i.e., large scales, which may include porosity or permeability parameters PARAM) generally have an important impact on fluid flow 102 in the reservoir 104 and are well characterized by the production data [4-6]. Note that reservoir 104 may have one or more production wells 106 and/or data collecting wells. Moreover, property contrasts derived from facies modeling or seismic inversion, are not affected by the perturbations of low frequencies. In this regard, geological objects such as channels, are characterized by sharp high-frequency transitions of properties and seismic reflection data only give information about property contrasts and are band-limited such that they do not record low frequencies [7]. Therefore, the method of this embodiment method postulates that the match of the production data can be improved by primarily modifying low-resolutions, with a limited impact on the prior characterization and without introducing noise in higher frequencies. Under this hypothesis, a multi-scale re-parameterization of the model variables is appropriate.

Information carried by the production data is spatially heterogeneous [6], the flow response being more affected by the variations of parameters close to the wells 106, where true correlations exist between the dynamic flow response 102 and the high frequencies. Far from the measurements, high frequencies are generally not characterized by the data, except when they have an important impact on fluid flow, (e.g., fine flow barriers). Therefore, the parameterization should be defined both in space and frequency.

In this embodiment, the property fields are decomposed in space and frequency using a grid-adaptive second-generation wavelet parameterization. These wavelets are very efficient and can be applied on irregular reservoir grids containing dead or flat cells. Moreover, reservoir models typically contain hundreds to millions of unknown parameters and the available data are usually sparse and uncertain, which makes the problem under-determined. Thus, re-parameterization also helps stabilize the inversion by reducing the number of parameters, while preserving the main structures of the property fields, thanks to the compression properties of wavelets.

Based on this parameterization, a multi-scale inverse approach is applied. The multi-scale inverse approach uses different subsets of wavelet coefficients that are successively updated with the production data using the iterative Levenberg-Marquardt ensemble-based randomized maximum likelihood (LM-enRML) [8, 9] as the optimization method. The algorithm initially optimizes an initial subset of large-scale coefficients. The parameterization is then progressively refined, and a new optimization is run each time new coefficients are added to the subset. However, the prior realizations may include uncertain fine-scale heterogeneities, which also have a significant impact on the flow response. For this reason, these high frequencies are attenuated during the optimization of the large-scale coefficients in order to avoid bias in their estimation. The original values of the attenuated coefficients are then easily restored once they have been included in the optimization. Finally, the refinement process stops when all or most of the coefficients are part of the optimization set. The mismatch being reduced during the first optimizations of the large scales, the perturbation at finer scales is then limited. Although re-parameterization helps identify sensitive parameters, it does not remove spurious correlations of the ensemble (i.e., correlations that do not exist, but appear in the ensemble because of its limited size). In ensemble-based methods, localization is used to attenuate these effects and avoid the deterioration of the ensemble.

In one embodiment, a new space-frequency localization of the Kalman gain is used. In this embodiment, it is assumed that the flow response is highly sensitive to the large-scale coefficients as they are corresponding to wavelet functions that are covering all the domain and data, whereas fine-scale coefficients (local high-frequency heterogeneities) only have an important impact close to the well locations as their corresponding wavelets have a more restricted impact on the property fields (smaller support). Thus, the localization is adapted to the current set of optimized parameters. At the beginning of the process, when only large scales are optimized, the correlations between parameters and data are assumed reliable and no regularization needs to be applied, which allows for global updates of the property fields. The localization later becomes effective when less sensitive coefficients are used in the optimization.

The algorithm is tested on two history-matching cases. The first one is a 2D synthetic channelized reservoir with about 6 years of production history measured in nine producer and four injector wells. The second test is the Brugge benchmark case with 10 years of history. The results of the multi-scale approach are compared with the grid-block-based LM-enRML optimization with distance-based localization. While both methods perform well in matching the data, the regularization effect of the multi-scale approach avoids addition of noise and allows a better preservation of the models by minimizing the amplitude of the updates.

1.1 Features

The embodiments of the multi-scale method include one or more of the following features:
1. Grid-adaptive second generation smooth wavelets are used to re-parameterize property fields contained in complex stratigraphic reservoir grids;
2. A sequence of LM-enRML optimizations is performed with an adaptive subset of optimized coefficients, initially composed of a few sensitive coarse-scale coefficients and progressively refined allowing more important updates on a limited number of sensitive coefficients of higher resolution;
3. A reversible scheme attenuates the effects of non-included coefficients during the first optimizations in order to avoid bias in the estimation and then restores their influence on the fluid flow when they are added into the subset of optimized coefficients. This allows incorporation of prior knowledge at all scales during the multi-scale inversion process; and
4. A multi-scale space-frequency localization method and a specific control of the LM-enRML optimization, which depend on the subset of optimized coefficients, are used to further regularize the problem.

2. GENERAL OBSERVATIONS 2.1 Multi-Scale Approaches and Re-Parameterization

Multi-scale methods are used in history matching [10-15] in order to adapt the parameterization to the data, stabilize the inversion, and avoid over parameterization (i.e., the use of an excessive number of parameters to explain the data). Although not formally proven, multi-scale optimization is considered to help avoid local minima [16-18] or lead to simpler optimum solution [19]. These methods start by optimizing a limited number of large-scale coefficients. The parameterization resolution is then increased by analyzing the results of the optimization step: refinement indicators can be computed using the sensitivity matrix and/or the gradient in order to choose new parameters that will help reduce the value of the objective function at the next iteration without over-parameterizing the problem.

Different multi-scale parameterizations are found in the petroleum literature, as reviewed by [3, 14]. Methods based on adaptive zonation usually start with a coarse model and sequentially refine local regions depending on their impact on the flow response [10, 11]. A significant challenge with these methods is to use prior information at different scales, which is essential when other source of data are integrated in the model. Multi-scale geostatistical-based parameterization techniques [20] manage to preserve spatial variability, but cannot handle prior models that contain geological structures or seismic-derived information.

More common re-parameterizations based on linear transformation perform a change of basis. Interesting characteristics can result from these transformations, such as multi-scale decomposition, sparse representation, or parameters de-correlation. Methods based on the covariance of the model variables, such as principle components analysis (PCA) or Karhunen-Loeve transform (KLT) [21, 22] have been used to reduce the dimension of inversion problems. In petroleum reservoirs, however, the covariance is rarely known a priori and the computation of the basis can be problematic for large problems.

More recent approaches coming from the numerical image compression have the advantage to be independent of the prior knowledge and are computationally effective. Two main transformations are used in reservoir history matching: the discrete cosine transform (DCT) [5, 23-25] and the discrete wavelet transform (DWT) [4, 6, 13]. For DCT, the transformed domain is characterized by global cosine functions, whereas the DWT uses more complicated functions called wavelets, which are also localized in space. With these parameterizations, the coarse resolutions of a signal can be optimized by only using specific coefficients whereas high resolutions characterized by the prior information (seismic, conceptual models, etc.) are not modified.

It is generally difficult in multi-scale approaches to account for prior information at all frequencies as the parameterization evolves and is not initially adapted to the frequency content of the prior information. In order to address this problem, Feng and Mannseth [26] proposed a predictor-corrector strategy, which enables the downscaling of the multi-scale estimate and assimilation of prior covariance functions. Sahni and Horne [6] proposed to fix some wavelet coefficients for history-matching and use the remaining coefficients to match a variogram. However, these techniques are difficult to use when detailed prior information, such as seismic derived attributes or complex geological structures, is available.

Although re-parameterization with few low-scale parameters gives satisfying results when applied to smooth synthetic cases, the optimization of the coarse scales is generally not sufficient to achieve a satisfying match of the production data. Fine-scale heterogeneities can have a large impact on the flow response where the changes of the dynamic properties are important and more frequencies need to be included in the inversion. Since these parameters are subject to spurious correlations, it is necessary to ensure that only sensitive parameters are modified during the ensemble-based optimization in order to preserve the information carried by the prior models.

2.2 Localization

In real applications, when the ensemble size is relatively small as compared to the dimension of the problem, localization helps prevent the spurious updates of variables that are not sensitive to the observation. Element-wise multiplications with a screening matrix are generally used to regularize the covariances matrices [27-29] or the Kalman gain [29, 30] directly. Distance-based localization are used in atmospheric and petroleum applications to limit the update of the parameters within a certain distance of the observed dynamic data. Localization functions, usually chosen based on experience, are used to define the screening matrix. Their ranges are dependent on the size of the ensemble as it conditions the quality of the covariance approximations [27, 28, 31]. When distance-based functions fail to regularize correctly the ensemble update, sensitivity analysis may be used to define localization area [29], but can turn out to be fairly complex. Moreover, for parameters such as relative permeability curves or fluid contrasts, a distance interpretation is not relevant.

In this case, more general methods have been proposed for limiting the effects of the spurious correlations [4, 32, 33]. These methods can benefit from re-parameterization as it helps bring out important parameters. Chen and Oliver [4] apply the bootstrap method to wavelet coefficients and show that the estimate of the Kalman gain for the low frequencies using a small ensemble is less subject to noise. However, the automatic adaptive localization fails to estimate correctly the correlations associated with the high frequencies (fine scales).

2.3 First- and Second-Generation Wavelets

The discrete wavelet transform is a linear transformation which decomposes a signal into different frequencies without increasing the number of coefficients. Its basis is composed of finite support functions called wavelets. Each wavelet is associated with a frequency range and a finite localization in space. This property is used in image compression where high-frequencies are only included where they bring important information, for example, to characterize a sharp color variation. Since images or reservoir properties are generally spatially correlated, only a few wavelet coefficients are needed to obtain a good approximation of the original signal. For this reason, wavelet-based re-parameterization of an ill-posed inverse problem is interesting as it yields a significant reduction in the number of inverted parameters. However, unlike image compression in which coefficients are selected based on their impact on the visual aspect of an image, the history-matching method selects, according to an embodiment, additional frequencies only where they have an important impact on the flow response.

Figure 2:
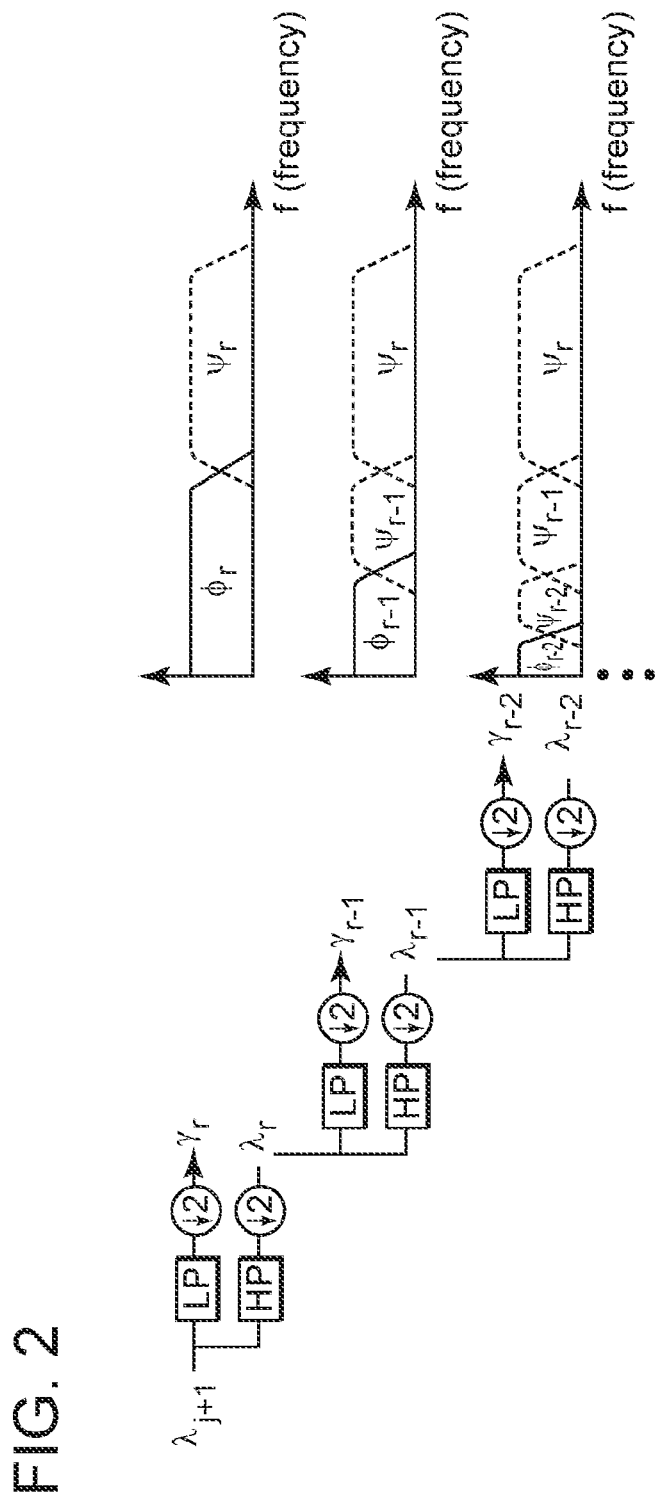
FIG. 2 illustrates a wavelet filter bank.

Standard first-generation wavelet basis [34, 35], $\psi_{r,k}(t)$, is built from translations and dilatations (by a factor of two) of a generating function $\psi(t) \in L^2(R)$, called the mother wavelet:

$$\psi_{r,k}(t) = \frac{1}{\sqrt{s_0^r}} \psi\left(\frac{t - k\tau_0 s_0^r}{s_0^r}\right) \quad (1)$$

where $\tau_0$ and $s_0$ correspond respectively to the translation and dilatation factor, which are usually set to $\tau_0=1$ and $s_0=2$. Indices r and k refer to the frequency and space localization of the wavelet. With the decrease of r, the frequency spectrum covered by the wavelets are compressed by a factor of two and translated from high to low resolutions, as illustrated in FIG. 2. For each set of wavelets, it is possible to define a complementary set of functions, $\Phi_{r,k}(t)$, which cover the rest of the spectrum of the signal (see FIG. 2), called the scaling functions [35]. Similarly to the wavelets, the scaling functions are built from a generating function (called the father wavelet) by translation and dilatation. Scaling functions have a low-pass nature and, for this reason, are sometimes called averaging functions.

Because of translation-dilatation invariance, first-generation wavelets are usually only applicable to regularly sampled infinite signals or bounded signals of dimensions equal to a power of 2.

For this reason, second generation wavelets [37] are used herein, which can be applied to any grid (more explanations provided in Appendixes 2 and 3). Second-generation wavelets lack the translation and dilatation invariance property. Instead, they are adapted to their spatial localization, but keep the same space frequency localization property as traditional wavelets. The full wavelet transform follows the lifting scheme [37]. This process performs in-place processing of the signal, which reduces computer memory requirements as compared to standard first-generation transform implementations. It is composed of reversible operators that are applied sequentially on a sequence of coefficients (see Appendix 1). The main purpose of these operators is to improve the properties of an initial wavelet. The lifting of the Lazy wavelet [37] (Split operator, see Appendixes 1 and 2) and the Haar wavelet (Appendix 3) is presented in the Appendix. In this embodiment, the grid-adaptive wavelets are used, which can handle dead or flat cells, by accounting for the volume of the cells during their construction.

3. GRID ADAPTIVE 3D WAVELETS TRANSFORM

The lifting also enables the construction of grid-dependent wavelets. The scheme used in this embodiment takes into account the cell volumes, as described in Appendix 2, in order to handle zero volume cells (dead cells) and obtain a weighted average of the property fields at coarse resolutions. Because the zero volume or dead cells do not participate in the reconstruction of the property field, the associated coefficients can be neglected and the number of active parameters is not increased after the transformation. In the examples presented here, a quadratic wavelet is used based on a polynomial interpolation of degree 2, which can be seen as an improved Haar wavelet ([38], Appendix 3). This wavelet is smoother than the Haar wavelet, which helps avoid the introduction of sharp artifacts after perturbations of the wavelet coefficients caused by the optimization. The quadratic wavelets have a compact support (i.e., area where the wavelet is not nil) comparable to the Haar wavelet (wavelet with the smallest support), which allows a more precise localization in space compared to higher order wavelets associated with larger supports and an easier interpretation of the contribution of each wavelet in the reconstruction of the property fields as the overlaps between these basis functions are limited. Nevertheless, depending on the property of a signal (e.g., smooth and repeated pattern) and the field of application of the transform (e.g., compression and inversion), a wavelet transform may turn out to be more efficient than another.

For two- or three-dimensional (2D and 3D) signals, it is possible to use 2D or 3D wavelet functions or to perform 1D transforms along each direction. The first approach is still rarely used as 2D or 3D wavelets are more difficult to create and the transform can be computationally less efficient. The second approach, followed in this embodiment, is widely used in image compression because of its efficiency. The original 3D (or 2D) signal is decomposed into several 1D signals aligned along a first direction of the grid. One level of the wavelet transform is applied independently of each 1D signal, which results in the computation of detail and scaling coefficients, as illustrated in FIGS. 3A and 3B. The 1D decomposition and wavelet transforms are repeated for each direction on both the detail and scaling coefficients, as illustrated in FIGS. 3C and 3D. The same process is then repeated on the remaining scaling coefficients until the coarsest resolution is reached as illustrated in FIGS. 3A and 3B.

Different wavelets can be used in the different directions, depending on the spatial variations of the properties. In a 3D reservoir model, the lateral property transitions inside a given layer can be smooth whereas the property transitions between layers can be sharp. In this case, smooth wavelets can be used laterally whereas sharp wavelets (e.g., Haar wavelet) can be used vertically. Lateral anisotropy can also be handled by using different wavelets depending on the correlation. Typically, high-order wavelets will be more efficient when the property correlation is important.

In the examples presented here, independent 2D wavelet transforms are used on either 2D grids or 3D grids with geologically independent layers.

In the following, it is denoted by $m \in \mathbb{R}^n$ the property vector of size $n=n_p \times n_{grid}+n_d$ in the grid-block space, where $n_p$, $n_{grid}$, and $n_d$ are the number of spatial properties (e.g., grid-block porosity, and permeabilities), the size of the grid, and the number of flow simulator parameters (e.g., relative permeabilities); $\gamma \in \mathbb{R}^n$ the vector of all wavelet coefficients; and W the direct wavelet transform such that $\gamma=Wm$ and $W^{-1}$ the inverse wavelet transform.

4. OPTIMIZATION WITH A SUBSET OF WAVELET COEFFICIENTS

4.1 Notations

In this section, mathematical notations used to define and access submatrices or subvectors of a given matrix or vector are introduced. Let n and k be integers with $1 \le k \le n$. $Q_{k,n}$ is the totality of all sequences of k integers where the elements of the sequence are strictly increasing and chosen from $\{1, \ldots, n\}$. Let $A=(a_{ji})$ be a (m×n) matrix with elements $a_{ij} \in \mathbb{R}$. Let r and c be positive integers with $1 \le r \le m$, $1 \le c \le n$, and $\alpha \in Q_{r,m}$, $\beta \in Q_{c,n}$ two sequences of i and j indices of matrix A, such that $\alpha=(i_1, \ldots, i_r)$, $\beta=(j_1, \ldots, j_c)$. Then, submatrix $A[\alpha,\beta]$ has (l, t) entries equal to $a_{i_l,j_t}$ and has r rows and c columns. The increasing sequence $Q_{n,n}$ of all the elements of $\{1, \ldots, n\}$ is denoted by "*", such that $A[*, *]=A$. $A(\alpha, \beta)$ denotes the submatrix of A whose rows and columns are complementary to $\alpha$ and $\beta$, respectively.

In the following, the terms scale or resolution refer to frequency ranges carried by the wavelets (see FIG. 2) and n and $n_r$ are the total number of wavelets coefficients and the number of wavelet coefficients associated to the resolution r, with $n=\Sigma n_r$. $\{i_\gamma\}_r$ is the set of wavelet coefficient indices of resolution r and $(\{i_\gamma\}_r) \in Q_{n_r,n}$ is its corresponding increasing sequence. Finally, $\{I_\gamma\}_{r,r'}=\{i_\gamma\}_r \cup \ldots \cup \{i_\gamma\}_{r'}$ is the set of all coefficient indices from resolution r to r' and $q_{r,r'} \in Q_{n_r+\ldots+n_{r'},n}$ is its corresponding increasing sequence. With these notations, the universe (set of all wavelet coefficient indices) is defined as $U=\{I_\gamma\}_{0,r_{max}}$, where r=0 and $r=r_{max}$ correspond to the coarsest (or lowest) (e.g., the mean) and finest (or highest) resolutions, respectively.

4.2 Optimization Method

4.2.1 Levenberg-Marquardt Ensemble-Based Randomized Maximum Likelihood

The Levenberg-Marquardt ensemble randomized maximum likelihood (LM-enRML) [9, 39] is an iterative Levenberg-Marquardt method which provides a quadratic approximation to the logarithm of the maximum a posteriori estimate using an ensemble of realizations. This approximation is then used to update simultaneously several realizations which are members of the ensemble [8]. In one application, the ensemble includes at least 20 members. In one application, the ensemble includes between 50 and 300 members. The more members, the better the results. The number of members is limited by the computing power of the computing device. The initial ensemble is sampled from a prior distribution (which might be conditioned by other data, such as core or seismic data) and deemed to be representative of the uncertainties before assimilation of the production data.

Each ensemble member (vector of parameters, i.e., cell porosities, permeabilities) $m \in \mathbb{R}^n$ is transformed into wavelet coefficients $\gamma \in \mathbb{R}^n$ by applying the lifting scheme. The optimization is then performed on a subvector of selected coefficients $\gamma^* \in \mathbb{R}^{n^*}$ with $n^* \le n$ such that $$\gamma^* = \gamma[\alpha] \text{ and } \gamma = \begin{bmatrix} \gamma^* \\ \gamma^c \end{bmatrix} = Wm,$$

where $\alpha \in Q_{n^*,n}$ and $\gamma^c = \gamma(\alpha)$ correspond to the indices of selected coefficients of $\gamma$ and the complement vector of $\gamma^*$, respectively. The corresponding property values used by the flow simulator can be reconstructed using the inverse wavelet transform, $W^{-1}$, such that $m=W^{-1}\gamma$.

One method of uncertainty quantification for large history-matching problems is to condition each individual member $j \in N$ to a data realization $d_j^0 \in \mathbb{R}^{n^d}$, generated from a prior multivariate Gaussian distribution characterized by the data mean $d_{obs} \in \mathbb{R}^{n^d}$ and the ($n^d \times n^*$) data covariance, $C_D$ (often assumed diagonal) [40, 41]. This is accomplished by minimizing an objective function of the form:

$$S_j^{rml}\left(\begin{bmatrix} \gamma_j^* \\ \gamma^c \end{bmatrix}\right) = \frac{1}{2}(\gamma_j^* - \gamma_{pr,j}^*)^T C_{\gamma^*}^{-1}(\gamma_j^* - \gamma_{pr,j}^*) + \frac{1}{2}(g(m_j) - d_j^0)^T C_D^{-1}(g(m_j) - d_j^0) \quad (2)$$

where $\gamma_{pr,j}^* = \gamma_{pr,j}[\alpha]$, $C_{\gamma^*}^{-1} = C_\gamma[\alpha]^{-1}$, and g(.) are the subvector of the j th ensemble prior member $\gamma_{pr,j}$, the inverse of the submatrix of the covariance $C_\gamma$, and the forward model (i.e., flow simulator), respectively. Since the forward model is non-linear, the solution of this problem cannot be calculated analytically and calls for an iterative resolution. In one application, the objective function (2) is modified to include only the term $\frac{1}{2}(g(m_j)-d_j^0)^T C_D^{-1}(g(m_j)-d_j^0)$. However, the following equations are developed based on objective function (2). In one embodiment, only the evaluation of the mismatch and convergence use the above noted term, i.e., does not account for the prior deviation penalization term.

Gauss-Newton methods and, in particular, the Levenberg-Marquardt algorithm are known to be very efficient when the ($n^d \times n^*$) sensitivity matrix (or Jacobian), $$G = \frac{\partial g(m)}{\partial m},$$

is cheap to compute. For each iteration, a perturbation of the parameters is computed from the gradient (first derivative, steepest descent) and the Hessian (second derivative, shape) of the objective function. For non-linear problems, the approximation of the objective function can only be trusted around the current state of the model. In the Levenberg-Marquardt method, the Hessian is modified with a multiplier $\lambda$ in order to reduce the influence of data mismatch in early iterations and therefore limit the amplitude of the parameter updates. The perturbation, $\delta\gamma_l^*$, at the $l^{th}$ iteration is obtained by solving:

$$[(\lambda_l+1)+G_l^T C_D^{-1} G_l]\delta\gamma_l^* = -[C_{\gamma^*}^{-1}(\gamma_l^* - \gamma_{pr}^*) + G_l^T C_D^{-1}(g(m_l)-d^0)] \quad (3)$$

where the right and first left term of the equality correspond to the gradient and the modified Hessian of $S^{rmi}(\gamma)$. The ($n^d \times n^*$) sensitivity matrix $G_l$ is computed from the ensemble of $n^e$ realizations by solving:

$$\Delta D_l = G_l \Delta \Gamma_l. \quad (4)$$

Each column of the ($n^d \times n^e$) matrix $\Delta D_l$ and the ($n^* \times n^e$) matrix $\Delta \Gamma_l$ store, for each realization, the deviation of the predicted data, and deviation of the wavelets coefficients from the ensemble means, respectively [8]. Since the matrix is generally not invertible (or even square), (truncated) singular value decomposition ((T)SVD) is used to solve the system. If TSVD is applied, the parameters must be scaled in order to avoid the loss of valuable information [9]. Because of the reduction in the number of parameters ($n^* \leq n$) and the small size of the ensemble ($n^e \ll n$), the computation of G is relatively fast.

In this embodiment, the approximate form of the Levenberg-Marquardt method [9] is used, where the covariance matrix $C_{\gamma^*}$ in the Hessian is approximated by a positive definite matrix $P_l = \Delta \Gamma_l \Delta \Gamma_l^T /(n^e-1)$, which is computed from the current ensemble in each iteration. Using the Sherman-Woodbury-Morrison matrix inversion formulas [42] and substituting $C_{\gamma^*}^{-1}$ by $P_l^{-1}$ in the Hessian, (4) is written as:

$$\delta\gamma_l^* = -[(\lambda_l+1)P_l^{-1} + G_l^T C_D^{-1} G_l]^{-1} C_{\gamma^*}^{-1}(\gamma_l^* - \gamma_{pr}^*) - P_l^{-1} G_l^T [(\lambda_l+1)C_D + G_l P_l G_l^T]^{-1}(g(m_l)-d^0)] \quad (5)$$

Finally, the deviation from prior term is neglected (first term in Eq. 5) in which case the update is only driven by the data mismatch:

$$\delta\gamma_l^* = -P_l G_l^T [(\lambda_l+1)C_D + G_l P_l G_l^T]^{-1}(g(m_l)-d^0) \quad (6)$$

It is shown [9] that this form which gives slightly better data matches is numerically more stable and is computationally more efficient than the original form (Eq. 5). From the inventor's experience, this approximated form can give better matches when the initial ensemble of simulated responses is not enclosing the data, and the quality of the output realizations does not suffer from the loss of the prior deviation constraint. When the same ensemble is used to compute the sensitivity and the current covariance matrices, Eq. (6) simplifies to the ensemble smoother update and the sensitivity matrix does not need to be computed explicitly:

$$\delta\gamma_l^* = -C_l^{\gamma d}[(\lambda_l+1)C_D + C_l^{dd}]^{-1}(g(m_l)-d^0) = K_l^e(g(m_l)-d^0), \quad (7)$$

where $C_l^{\gamma d} = \Delta \Gamma_l \Delta D_l^T/(n^e-1)$ is the cross-covariance between parameters included in the optimization and simulated data, $C_l^{dd} = \Delta D_l \Delta D_l^T/(n^e-1)$ is the simulated data covariance matrix and $K_l^e$ is similar to the estimate of the Kalman gain.

4.2.2 Initial Smoothing of the Property Fields

Although only a subset of $n^*$ coefficients is optimized, all coefficients are used to reconstruct the properties needed by the flow simulator. However, for non-linear problems, it is generally useful to attenuate the impact of non-selected coefficients (mostly high frequencies) on the flow response in order to avoid bias in the estimation of the large scales and avoid local minima. At well locations, high resolutions may have an important impact on the flow response and can bias the characterization of the low resolutions if not removed. For example, fine-scale heterogeneities may introduce high or low permeability values (local drain or barriers) in the cells of the model that intersect or are located close to the well perforations. As these fine scales have an important impact on the flow response, but are not included in the optimization, it could result in an unrealistic deformation of the large scales (e.g., large increase or decrease of the permeability average) that attempt to correct a local state. In other words, this embodiment limits the influence of sensitive parameters that are not yet included in the optimization. Accordingly, the effect of wavelet coefficients that are not included in the optimization is attenuated before starting the optimization by multiplying them with an attenuation vector $s_0 \in \mathbb{R}^n$ such that, $$\gamma^s = s_0 \circ \gamma = \begin{bmatrix} \gamma^* \\ \gamma_s^c \end{bmatrix}, \quad (8)$$

where "$\circ$" corresponds to the Schur or Hadamard element wise product, $\gamma^*$ is the subvector of optimized coefficients, and $\gamma_s^c$ is the attenuated version of $\gamma^c$ (coefficients not used in the optimization). The application of the inverse wavelet transform on the vector $\gamma^s$ results in the reconstruction of smoothed property fields, as displayed in FIGS. 4A and 4B.

Generally, $s_0$ is not constant, but its elements vary with the resolution and location of the corresponding wavelet coefficients. In this embodiment, the values of the elements of $s_0$ decrease linearly with the resolution of the associated parameters from 1 (no attenuation) to a minimum value (strongest attenuation), $s_{min}$, set to 0.1 in the applications presented here, such that:

$$\forall r \in \{0, \ldots, r_{max}\}, \forall j_r \in \{i_\gamma\}_r \quad (9)$$

$$s_0(j_r) = \min\left(1, \frac{(1-s_{min}) \times r + s_{min} \times r_0 - r_{max}}{(r_0 - r_{max})}\right)$$

where r is the resolution associated with the wavelet coefficients from the coarsest (r=0) to the finest (r=$r_{max}$), $r_0$ is the starting resolution for the optimization (see Section 5), and $\{i_\gamma\}_r$ is a set of wavelet coefficient indices, $j_r$, for resolution r. More sophisticated approaches based on parameter sensitivity or prior uncertainty can be used for the initial smoothing.

Figure 4A:
FIG. 4A shows the original porosity realization and FIG. 4B shows its smoothed version at the beginning of the optimization after attenuation of the high frequencies.
Figure 4B:
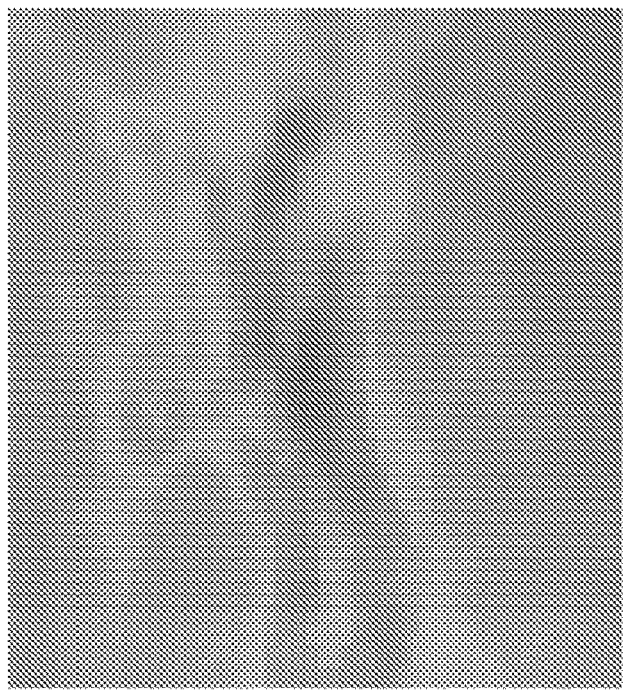

As discussed later, the attenuation values need to be greater than 0 in order to compute the sensitivity or the cross-covariance (Eqs. (4) or (7)) of the wavelet coefficients after refinement of the parameterization and to restore the original value of the coefficients. Thanks to the compression property of the wavelet basis, all important features are still preserved, as illustrated in FIGS. 4A and 4B. The attenuated frequencies are easily restored during the process by multiplying the wavelets coefficients by $s_0^{-1}$, such that $\gamma = s_0^{-1} \circ \gamma^s$ (see Section 5 and Algorithm 2 in Appendix 4), where $s_0^{-1}$ is the element-wise inverse of $s_0$.

In general, the minimum attenuation factor $s_{min}$ associated with high frequencies need to be small in order to avoid an incorrect estimation of the lower scale coefficients that impact the entire domain. The strategy proposed in Eq. 9 does not claim to be optimal or generic, but it was observed that an increase of $s_{min}$ results in a smaller decrease of the objective function when optimizing the low frequencies and a too important attenuation (i.e., decrease of $s_{min}$) can result in an increase of the objective function when restoring the original value of the coefficients in the last iterations (see Section 5). Note that all the elements of $s_0$ corresponding to the coefficients $\gamma^*$ are equal to one since they are included in the optimization (see Eq. 9).

5. MULTI-SCALE APPROACH

Figure 5:
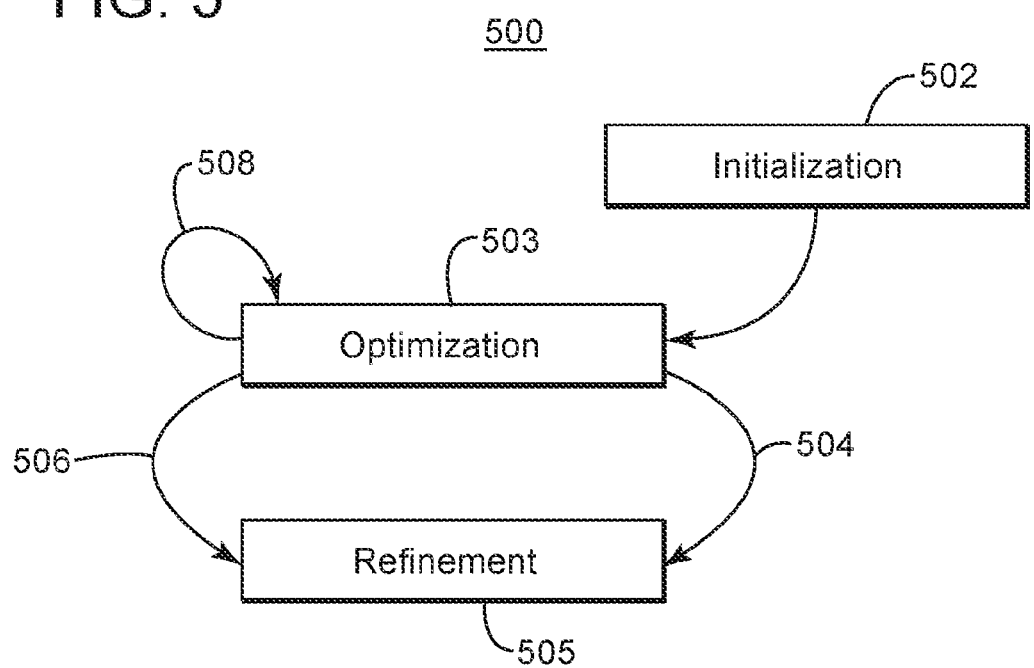
FIG. 5 illustrates a multi-scale method.

A multi-scale approach is used herein based on the LMenRML optimization using wavelet parameterization, which includes highly detailed prior knowledge. An overview of this method is given in FIG. 5. The main central loop 504 and 506 corresponds to iterations through the different resolutions. Before entering the loop, in step 502, some low resolutions (from 0 to $r_0$) wavelet coefficients, $\gamma_{r_0}^*$, are selected, such that $\gamma_{r_0}^* = \gamma[q_{0,r_0}]$ and a reversible attenuation (Section 4.2.2) is applied to the remaining coefficients, $\gamma_{r_0}^c = \gamma[q_{0,r_0}]$. The initial selection should only include coefficients associated with wavelets, $\Psi^*$, that are covering at least one element of the observed data locations set, $P_d$, such that, $$\forall \psi_{r,k} \in \Psi^*, \exists x_d \in P_d | (\psi_{r,k} * \delta_{x_d})(x) > \epsilon, \tag{10}$$

where (*) is a convolution operator, $\psi_{r,k}$ denotes wavelets of resolution r and position k, $\delta_{x_d}$ is a Dirac function centered on the location $x_d$, and $\epsilon$ is a minimum impact value.

Moreover, the initial parameterization should include a minimum number of parameters so that the main features of the prior realizations remain discernible after attenuation of the high frequencies (see FIGS. 4A and 4B) in order to avoid convergence at large scales that is not compatible with the prior information at finer scales. Visual qualitative controls of the preservation of the main features of property fields after smoothing tests have been used in this embodiment to select the initial coefficients (starting resolution) for the applications examples of Section 6. Sensitivity or prior uncertainty analysis can also be used for selecting the most relevant coefficients.

In step 503, parameters $\gamma_r^*$ are optimized using the LM-enRML algorithm as described in Section 4. Although the ensemble is generally not large enough to obtain a perfect estimate of the Kalman gain for the full parameterization, it usually gives a good approximation for the large-scale coefficients. It is emphasized here that the wavelet transform by itself does not remove the spurious effects related to the use of a small ensemble, but only helps re-parameterize the problem with few sensitive parameters. In geological or atmospheric applications, only a limited number of large-scale scenarios of variation of the spatial properties are consistent with the physics, the depositional processes, and the prior knowledge, which enable a better approximation of the parameters distribution with a small ensemble. The simulated response is also very sensitive to these coefficients as their associated basis functions are covering a large part of the model. However, during the first resolutions, because all the coefficients needed to match the data that are not included, it is not recommended to seek convergence as it can lead to unrealistic updates. Moreover, the optimization of the low frequencies is only performed after attenuating the effect of the fine-scale parameters (see Eq. 8) in order to avoid bias in the estimation (see Section 4.2.2).

Then, in step 505, new parameters corresponding to the next finer resolution r+1 are added with their original values and the attenuation vector $s_r+1$ is updated, such that, $$\gamma_{r+1}^* = s_r[q_{0,r+1}]^{-1} \circ \gamma^s[q_{0,r+1}] \tag{11}$$

$$\forall j \in \{I_\gamma\}_{0,r+1}, s_{r+1}(j)=1. \tag{12}$$

The influence of the finer scale are also partially reintroduced by multiplying the non-included coefficients by a factor $\epsilon_s$ set to 1.15 in the applications presented here, such that the original values of the coefficients are progressively restored (see Algorithm 2 in Appendix 4):

$$\forall j \in \{I_\gamma\}_{0,r+1}^c,$$

$$\gamma_{s,r+1}^c(j) = \gamma_{s,r}^c(j) \times \epsilon_s \tag{13}$$

$$s_{r+1}(j) = s_r(j) \times \epsilon_s \tag{14}$$

where $\{I_\gamma\}_{0,r+1}^c$ is the complementary set of non-included wavelets coefficients indices (indices of $\gamma_{s,r+1}^c$). Finally, a new optimization is run in step 508 with the new parameterization. In order to avoid running specific flow simulations for the unsmoothed realizations, the results of the last evaluation of the objective function before refinement are used to compute the first update with the new parameterization. For this reason, the initial attenuation factors need to be greater than 0.

This process (503 to 508) is repeated until the finest resolution is reached and a stopping criterion (Section 5.2) is fulfilled at the optimization step 503. Because of the initial attenuation of the coefficients, the process should not end before entering the finest resolution even if the data are sufficiently well matched since some prior knowledge could be lost.

5.1 Multi-Scale Localization

The objective of the localization in ensemble-based optimization is to minimize the difference between the true Kalman gain, K, and the estimate of the Kalman gain, $K_e$, affected by spurious correlations considering that it is computed from an insufficiently large ensemble. This can be achieved by multiplying element-wise the estimate of the Kalman gain by a screening matrix A that minimizes function:

$$f(A) = \|A \circ K^e - K\|_f^2, \tag{15}$$

where $\|.\|_f^2$ is the Frobenius norm.

In one embodiment, two screening matrices, $A_{gb}$ and $A_{wt}$ are defined and applied sequentially in the grid-block and wavelet spaces in order to regularize the estimate of the Kalman gain. In this novel approach, the first regularization is based on distance functions defined in the grid-block space that vary with the resolution while the second regularization is derived from a user-defined pseudo-sensitivity map which is translated into the space-frequency domain. Although the two regularizations are related to the position of the coefficients in space and frequency, they are serving different purposes. The grid-block localization only limits the update of the parameters inside pre-defined areas without distinguishing between frequencies, whereas the wavelet localization only restricts the updates of some frequencies at some locations, but allows global modifications of the property fields.

5.1.1 Multi-Scale Grid-Block Localization

Distance-based localization aims at regularizing the estimate by limiting the effects of the data to sensitive areas. Equivalently, distance-based localization can be seen as the decomposition of one large problem into several smaller semi-independent problems that are less affected by the spurious correlations as only a reduced number of parameters with significant correlations to the data are included.

In this embodiment, a modified localization to the current parameterization used in the optimization is proposed. A localization function, $A_{gb}$, similar to the one proposed by Furrer and Bengtsson [31] is used to screen the estimate of the Kalman gain in the grid-block space:

$$A_{gb}(h, r) = \frac{1}{1 + [f(0, r)^2/f(h, r)^2]/n^e}, \quad (16)$$

where $f(h, r)$ is a distance function which depends both on the separation distance h and the resolution r of the multi-scale loop. In the first iterations of the multi-scale loop, the dimension of the problem is highly reduced as only few large-scale parameters are optimized. As discussed before, the distribution of these parameters is generally better sampled by the ensemble and these parameters are generally sensitive, which gives a better estimation of the Kalman gain. However, recall that the initial smoothing prevents introduction of a bias induced by the effect of the high resolutions. In this embodiment, no regularization needs to be applied and the localization functions are constant functions equal to one, allowing global updating of the realizations without introducing noise in finer resolutions. With successive refinements, the number of parameters increases and the estimate of the Kalman gain becomes more affected by the spurious correlations. As a consequence, the range of the distance function decreases and the updates are applied in smaller sensitive areas. At the finest resolution, the localization function simplifies to the one proposed by Furrer and Bengtsson [31].

As localization is defined in the grid-block and because of the use of the Hadamard product in Eq. 15, it is not straightforward to apply localization directly in the wavelet space $(W(B \circ C) \neq W \cdot B \circ W \cdot C$, where B, C represent any matrices with consistent dimensions). Instead, the Kalman gain is transformed back into the grid-block space where the localization is applied and is then re-transformed into the wavelet space in order to update the reduced set of wavelet coefficients (see Algorithm 3 in Appendix 4), such that:

$$K^{tmp} = W(A_{gb} \circ (W^{-1} \cdot K_{n,n^d}^{\gamma^*}))$$

$$K^{\gamma^*} = K^{tmp}[q_{0,r}, *] \quad (17)$$

where $K^{tmp}$ is a $(n \times n^d)$ temporary matrix, $K_{n,n^d}^{\gamma^*}$ is a $(n \times n^d)$ matrix defined such that, $K_{n,n^d}^{\gamma^*}[q_{0,r}, *] = K^e$, and $K_{n,n^d}^{\gamma^*}[q_{0,r}, *] = 0_{n-n^*,n^d}$ where $K^e$ is the $(n^* \times n^d)$ estimate of the Kalman gain for the selected wavelet coefficients and $0_{n-n^*,n^d}$ is a $((n-n^*) \times n^d)$ zero matrix corresponding to the non-selected coefficients, and $K^{\gamma^*}$ is the resulting localized $(n^* \times n^d)$ Kalman gain in the wavelet space. Thus, even the update of global parameters, such as the mean, only have impact inside localizations areas at the current resolution. Unless a strict stationarity of the property field can be assumed, it is important to limit the effect of the global parameters when the parameterization is refined. Indeed, with the inclusion of high frequencies, the estimation of the large-scale parameters, far from the data, is biased by the local state (except in strictly stationary state). In other words, incorrect extrapolations of local observations are avoided. The wavelet transform being fast and easily parallelizable, the transformation and reconstruction of the Kalman gain take a reasonable amount of time compared to the ensemble of the fluid flow simulations.

5.1.2 Regularization of the Kalman Gain in the Wavelet Space

For large problems, even by taking into account spatial dependencies, it is generally not possible to ensure total suppression of the spurious correlations. Localization functions generally depends on the size $n^e$ of the ensemble [31] as in Eq. 16, meaning that when the ensemble is small, the localization may become very restrictive and only allows updates of a limited numbers of parameters, which conversely may remove true correlations and lead to bad data match or create artifacts. Generally, the localization function should be larger than a single pattern and include nearby wells [29]. In this embodiment, another kind of regularization, based on the adaptive localization presented in [4], is used in addition to the space localization described above.

According to this embodiment, a regularization of the estimate of the Kalman gain in the wavelet space is applied. Generally, parameters close to the well measurements will have a significant impact on the flow response and fine scales heterogeneities are more likely to be characterized, whereas far from wells, only low frequency content can be deduced from the data (except in very heterogeneous reservoirs). Accordingly, pseudo-sensitivity maps are first defined in the grid-block space and aim at identifying areas where production data are highly informative. Distance functions with small ranges are used to generate these maps, where values drop rapidly from 1 to 0 with the inverse of the distance from the location of the data. Because water cuts are sensitive to the heterogeneities between producer and injector, a larger range is used in order to include more fine scale parameters between the wells. Then, this knowledge is translated into the wavelet space by considering that the reliability of the cross-correlation between data and wavelet coefficients is related to the sensitivity of the area covered by the basis functions. Thus, operators similar to the scaling functions are used to integrate the values of the pseudo-sensitivity maps over the support of the wavelet functions in order to estimate the importance of the different wavelet coefficients.

If the Haar transform is used to decompose a given 1D property and if it is denoted by $m_{j+1,k}^s$ the initial pseudo-sensitivity map, then the value $m_{j,k}^s$ associated with the wavelet coefficient $\gamma_{j,k}$ is computed, such that, $$m_{j,k}^s = m_{j+1,k}^s + m_{j+1,k+1}^s. \quad (18)$$

This operation is performed on the remaining $m_{j,k}^s$ values until the coarsest resolution is reached in the same manner as the cascade algorithm (see FIG. 2). For a 2D or 3D property, the process is successively applied along the different directions, and the resulting values correspond to the sum over a surface or a volume. Thus, the importance of the wavelet coefficients increases quickly when their frequencies decrease and only the finest frequencies are affected by this regularization (large-scale correlations are supposed reliable as shown in [4]). The final values are then leveled to 1 in order to be used as elements of the $(n^* \times n^d)$ screening matrix $A_{wt}$ of the Kalman gain in the wavelet space, such that:

$$K_{loc}^{\gamma^*} = A_{wt} \circ K^{\gamma^*}, \quad (19)$$

where $K_{loc}^{\gamma^*}$ is the resulting Kalman gain after both regularizations in the grid-block and wavelet space. Even though the term pseudo-sensitivity is used to define the maps in the grid-block space, the matrix $A_{wt}$ is not an approximation of the sensitivity in the wavelet space, but is only used to identify the reliable correlations between the parameters and data.

When higher order wavelets are used, the sum in Eq. 18 includes more elements (depending on the order of the wavelet) with different weights deduced from the associated scaling functions. Because scaling functions, in the second-generation context, are changing with the sampling of the signal and are not computed explicitly, it can be difficult to define correctly the corresponding integrating functions and approximations can be made. In this embodiment, a wavelet based on a quadratic average interpolation is used to decompose the properties, but the computation of the screening coefficients are based on the Haar case (Eq. 18) as the two wavelets are quite similar (see Appendix 3).

5.2 Optimization and Control of the Levenberg-Marquardt Parameter

In the multi-scale method, an optimization 503 is performed after each refinement 505 of the parameterization. During the first resolutions, the parameterization only includes large scale parameters and the problem is simplified, thanks to the initial smoothing of the realizations, which allows a fast convergence. However, because the problem is generally under-parameterized at this stage (i.e., the parameterization does not contain enough degrees of freedom to match the data), it is not suitable to reach full convergence as it would result in unrealistic solutions. Moreover, the initially smoothed components reintroduced during the refinement step might be incompatible with the current optimal state. For these reasons, only one LM-enRML iteration 506 is performed at each resolution level while the total number of parameters is lower or equal to the total number of data. At intermediate scales, when iterations are allowed, refinement criteria based on the maximum number of iterations and the improvement of the mismatch are applied. Because all the parameters are not optimized and finer scales have been smoothed, only a few iterations are permitted. In the applications presented in this embodiment, the maximum number of iterations at an intermediate scale is limited to 2, but the control of the iteration would benefit from automatic techniques based on the approximation of the objective function, as described in [11]. Several stopping criteria are used for the last optimization (at the finest resolution), including total number of flow simulations, maximum number of iterations, maximum increase of $\lambda$ at one iteration, or whether the mismatch falls within production data uncertainty ($S_{av} < n^d$).

Initialization and control of the Levenberg-Marquardt parameter $\lambda$ are based on the initial mismatch of data and the evolution of the ensemble mean, $S_{av}$ (see Eq. 20 below), and standard deviation of the data mismatch, $\sigma_S$, as described in [9]. When both $S_{av}$ and $\sigma_S$ decrease, $\lambda$ is reduced by a factor noted $\omega$, but is bounded by a minimum value. If $S_{av}$ is improved but $\sigma_S$ is increased, reflecting a heterogeneous improvement of the realizations, the ensemble update is accepted, but the value of $\lambda$ is kept unchanged. When $S_{av}$ is increased, the update is rejected and $\lambda$ is multiplied by a factor of $\omega$.

However, after refinement and restoration of the wavelet coefficients with their original values, a reasonable increase of the global objective function is tolerated. If $S_{av}$ after refinement is greater than the one before optimizing the parameters at the previous resolution, the update is rejected and only half of the frequency components are reintroduced at the next update. When the update is accepted, but the objective function is not improved, the value of $\lambda$ is not changed (see Algorithm 1 in Appendix 4). A rejection at early stage may reflect a too strong initial attenuation of the coefficients or an incoherent prior information. In this case, incorporation of high frequency parameters inside sensitive areas (such as well neighborhood) from the start of the optimization can help stabilize the behavior of the objective function, but may affect the preservation of the prior information. The approach for selecting $\lambda$ described here is fairly standard and has worked well on similar history-matching problems [9, 43], but it is clear that the method of Iglesias and coworkers [44] might be advantageous in stabilizing convergence.

In standard approaches, $\omega$ is usually constant. In the multi-scale approach of this embodiment, the value of $\omega$ is tuned depending on the current resolution. In the first multi-scale iterations, the value of $\omega$ is kept low in order to maintain a relatively large $\lambda$ and limit the update of the large-scale parameters as it is generally not desirable to converge with a reduced parameterization. The value of $\omega$ is then increased with refinements and reaches its maximum at the finest resolution (see Algorithm 1 in Appendix 4). In the examples discussed later, the initial value of $\omega$ is set to 2 and increases linearly to 10 and $\lambda$ is bounded to 0.01. When the same control of the Levenberg-Marquardt parameter is used with the standard grid-block approach, the optimization struggles to reduce the objective function in the first iterations without improvement of the quality of the output models, whereas the updates of large-scale sensitive parameters allow significant improvements even with a relatively large 2.

6. REVIEW OF THE METHOD

The details of a method for calculating an ensemble of reservoir models that match seismic data and/or production data have been discussed above. This section summarizes the various parts of the method discussed above and also simplifies the understanding of the method and its novelties by omitting any mathematical detail. According to an embodiment illustrated in FIG. 6, the method 600 starts with step 602 in which data characterizing the reservoir is obtained/generated. One way to generate this data is using a 3D or 4D deterministic inversion method. Such an inversion method starts with seismic data (e.g., data collected with hydrophones, geophone, accelerometers or other seismic sensors) and generates through inversion the elastic parameters associated with the surveyed subsurface. An example of such elastic parameter are the impedances of the primary and secondary waves (Ip, Is), the rock velocities and density (Vp, Vs, Rho) or any derived elastic modulus (e.g., Poisson ratio, Young modulus) of the earth. Any inversion method may be used for deriving the elastic parameters.

Figure 6:
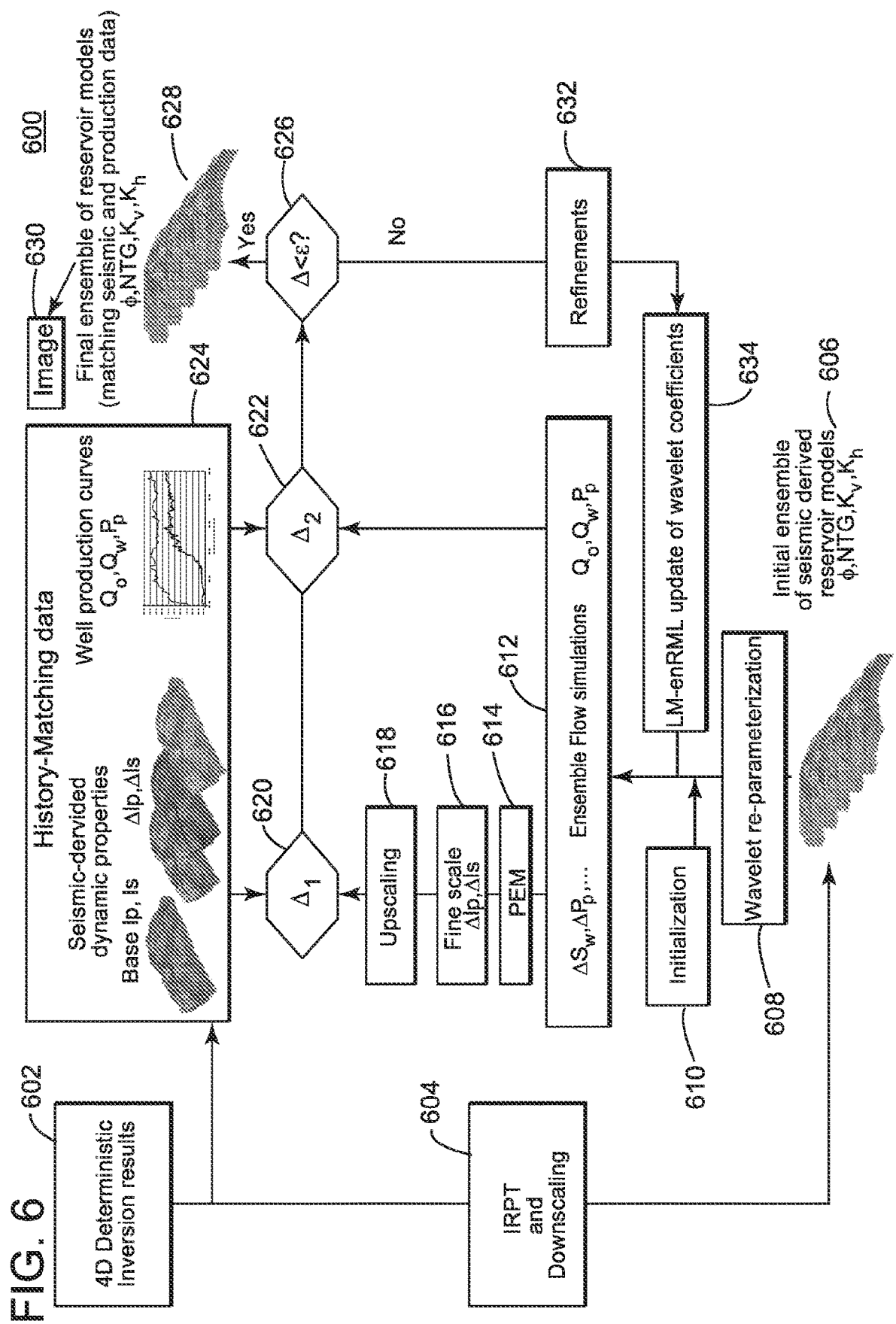
FIG. 6 is a schematic flowchart of a method for processing an ensemble and generating an image of the reservoir.

Then, in step 604, another inversion method IRPT (Inverse Rock Physics Transform) is applied to the input received from step 602 to generate petro-physical attributes (e.g., porosity, shale volumes, permeability). In this way, one or more realizations (petro-physical realizations of the subsurface) are generated and these realizations constitute the members of the ensemble. These realizations are shown in FIG. 6 at 606 and they include various parameters, e.g., Phi for Porosity, NTG for Net-to-Gross, Kv for vertical permeability, Kh for horizontal permeability. Step 604 may include a sub-step of downscaling the elastic attributes before IRPT because the reservoir grid is finer than the seismic data grid. A stochastic method may be applied for the IRPT for determining the realizations. Because these realizations are generated prior to applying the methods discussed above and they constitute the starting point of the ensemble calculations, these realizations are called in the art "prior realizations" or simply "prior." The number of the ensemble members varies from application to application depending on the size of the problem and the number of data to assimilate, but at least 20 members are desired. In one application, it is possible to have 2 or more members. However, the more members, the better results.

In step 608, the wavelet parameterization discussed in Section 3 is applied. Although many possible parameterizations may be used, the inventor has found that a grid-adaptive second generation wavelet parameterization works best in this context. This parameterization works in the space and frequency, i.e., the set of wavelet coefficients depends on both the frequency and space. In step 610, an initialization step is applied. This step, as discussed in Section 4, chooses a subset of the wavelet coefficients associated with the property fields describing the subsurface. The subset of wavelet coefficients may be chosen in different ways. One way would be to select only those wavelet coefficients that are associated with low-frequencies (large scale) and muting all the others coefficients.

In step 612, for each realization, flow and or geo-mechanical responses are estimated. A flow simulator (and/or geo-mechanical forward model) is applied for calculating the various parameters as now discussed. For the seismic data, various parameters $S_w$ and $P_p$ are calculated, where $P_p$ is the pressure and $S_w$ is any other parameter associated with the seismic data, e.g., porosity. On the production data side, various quantities $Q_o$, $Q_w$, and $P_p$ are also estimated/calculated. These quantities can be saturation, flow, pressure, or any other parameter associated with the production data (well location).

When data derived from 4D seismic (e.g., impedance variations with time) are used to constrain the inversion, the petro-physical parameters along with the simulated dynamic parameters (e.g., pressure, saturation) are used from step 612 to obtain steps 614 to 618. In step 614, a petro-elastic model is used to calculate the elastic response of the reservoir from the inverted properties (e.g., porosity, NTG) and simulated properties (e.g., saturation, pressure) of the rocks. When the resolution of the reservoir grid is finer than the resolution of the seismic data, upscaling is performed at step 618 so that the simulated elastic response obtained at step 616 can be compared to the seismic derived elastic data. This can be done by applying a frequency filter to the elastic parameters simulated inside the reservoir grid. The filter can be based on averaging or partial reconstruction using frequency transforms such as Fourier or wavelet transform.

The processed seismic data from step 618 or the estimated production data from step 612 are then compared in steps 620 and/or 622 with corresponding measured data obtained in step 624. Note that step 624 includes (1) measured seismic data and seismic-derived dynamic properties (e.g., impedance variations with time) and/or (2) well production data, e.g., well production curves of the saturation, flow and pressure. Thus, in step 620 estimated and measured seismic data are compared to each other and if a given criterion $\Delta_1$ is met, the method advances to step 626. The same is true for step 622, where a different criterion $\Delta_2$ is used. These criteria are discussed in section 5.2. In one embodiment, it is possible to use only step 620 and ignore step 622. In another embodiment, it is possible to use only step 622 and ignore step 620. In still another embodiment, it is possible to apply both steps.

Then, in step 626, an overall criterion $\Delta$ is used to evaluate all the parameters, both seismic and production. This criterion may be a function of the criteria $\Delta_1$ and $\Delta_2$ discussed above. This function may be a linear function with different weights for each individual criterion. If the overall criterion is smaller than a given threshold, then the process advances to step 628, where the final ensemble of reservoir models is generated. Note that the final ensemble matches the seismic and production data (history-matching) and also predicts the values of the various parameters associated with the subsurface. From here, a multidimensional image of the reservoir is calculated and adjusted forward model parameters are given in step 630 and displayed so that the operator can make predictions or other decisions related to the reservoir exploration. Note that the term "multidimensional image" (herein sometimes referred to simply as an "image") may include a vector of values that characterizes spatial properties and parameters (e.g., porosity, permeability, NTG, elastic attributes, fractures density, fault transmissibility, etc.) and dynamic states (e.g., saturation, pressure temperature, fault slipping) of the subsurface in an n-dimensional space, with n larger than one, and fluid and rock intrinsic characteristics (e.g., relative permeability, wettability, viscosity). For example, a particular example of a multidimensional image could be a 3D cube of porosity, permeability and fluid saturation values at different times stored in the above noted vector of values. In other words, the term "multidimensional image" refers to any representation of the surveyed subsurface that is described in terms of spatial properties, or parameters or both.

However, it is unlikely that the given threshold is satisfied the first time the process arrives at step 626. For this reason, a loop including steps 632 and 634 is followed and these steps include most of the mathematics discussed in the embodiments noted above. Step 632 refines the parameterization of step 608 and restores some of the attenuated (muted) wavelets coefficients with their original values. As discussed in step 610, during the initialization, only a subset of the wavelet coefficients is selected for initial calculations. At each refinement step 632, the subset of wavelet coefficients is multi-scaled by adding other coefficients that belong to the set but not the subset. At this step, the newly added wavelet coefficients recover their original values before the initial attenuation (smoothing). Coefficients that are still not included also partially recover their original values so that their impact on the reconstructed property field increases. The result is a new larger subset of coefficients that are optimized. Based on the optimized subset of coefficients and the remaining coefficients that are not optimized, the properties of the subsurface are reconstructed. In other words, although only a subset of wavelet coefficients are optimized, all the coefficients are used during the reconstruction of the property fields. That is why the coefficients that are not included in the optimization are attenuated (so that they do not have a major impact on the reconstructed properties). This process may be continued until all the wavelet coefficients are used. Note that multi-scaling means adding to an existing scale another scale. A scale, as was discussed above, is related to a given frequency range of the wavelet coefficients. Thus, if the initial subset of wavelet coefficients corresponds to low-resolution parameters, which is a large scale, the refinement step adds a smaller scale each time it is performed. However, the refinement step 632 may be skipped prior to performing step 634, in which case the existing subset of wavelet coefficients is just updated by step 634. In other words, the refinement step 632 does not have to be performed each time the process advances from step 626 to step 634.

In step 634, the wavelet coefficients are updated. As discussed in Section 4.21., the LM-enRML method is applied to update the wavelet coefficients. However, those skilled in the art would understand that other methods may be applied to update these coefficients. At this step, the Kalman gain is statistically computed for the new subset of coefficients using the previous flow simulations, although the flow responses correspond to properties fields that slightly differ from the current state as the newly added wavelet coefficients did not recover their original values at this time. In order to obtain reliable correlations between the newly added parameters and the flow response, it is desired to progressively re-introduce the smoothed component during the multi-scale iterations as explained above. As discussed in Section 4, a Kalman gain is calculated in step 634 and also two localizations are used for maintaining the Kalman gain as close as possible to the real one. The first localization is adaptive in space while the second localization is in the wavelet space. Such combination of localizations is novel in the field. A cost function is used in this step to update the wavelet coefficients. An example of such cost function is described by Eq. (2). Note that a variation of this cost function is also discussed in Section 4.2.1.

After the wavelet coefficients are updated, the process returns to step 612 and continues to step 626, when again it is evaluated whether the given criterion is met. The process may continue through steps 632 and 634 until all the wavelet coefficients are considered.

Figure 7:
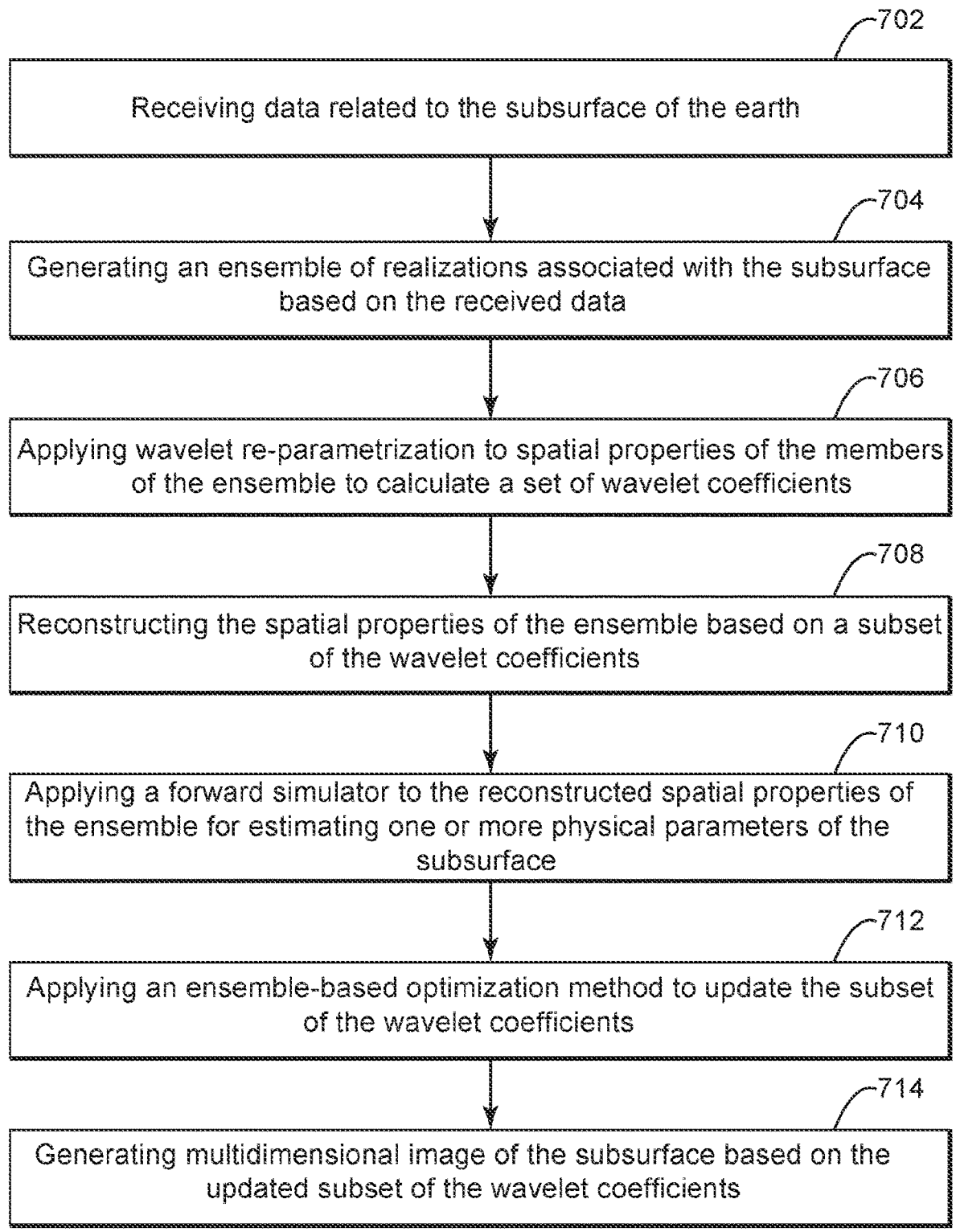
FIG. 7 is a flowchart of a method for generating an image of a reservoir.

The flow chart of a method 700 for calculating an ensemble of reservoir models and imagining such models is now discussed with regard to FIG. 7. FIG. 7 shows a method for generating an image of a subsurface of the earth based on an ensemble of realizations, the method including a step 702 of receiving data related to the subsurface of the earth, a step 704 of generating an ensemble of realizations associated with the subsurface based on the received data, a step 706 of applying wavelet re-parameterization to spatial properties of the members of the ensemble to calculate a set of wavelet coefficients, a step 708 of reconstructing the spatial properties of the ensemble based on a subset of the wavelet coefficients, a step 710 of applying a forward simulator to the reconstructed spatial properties of the ensemble for estimating one or more physical parameters of the subsurface, a step 712 of applying an ensemble-based optimization method to update the subset of the wavelet coefficients, and a step 714 of generating a multidimensional image of the subsurface based on the updated subset of the wavelet coefficients.

The method may further include a step of multi-scaling the subset of coefficients by adding other coefficients that belong to the set but not the subset, where the result is a new larger subset of coefficients that are used to reconstruct properties of the subsurface, which are used as input for the flow simulator. The subset of coefficients corresponds to low-resolution parameters, which correspond to a large scale. The step of multi-scaling may be repeated until all the coefficients from the set are used. In one application, the step of applying an ensemble-based optimization method is repeated for each new larger subset. In another application, the step of applying an ensemble-based optimization method includes calculating a Kalman gain for the ensemble. This step may also include applying a spatial localization to the Kalman gain and applying a wavelet localization to the Kalman gain. In one embodiment, the data includes at least one of seismic data and flow data associated with the subsurface. In one application, the at least one parameter is one of porosity, permeability, and saturation. In another application, the wavelet re-parameterization includes a grid-adaptive second generation wavelet parameterization and the ensemble-based optimization method is a Levenberg-Marquardt ensemble randomized maximum likelihood (LM-enRML) method. The LM-enRML method calculates a global gradient that is used to simultaneously update the members of the ensemble. The method may also include a step of matching history production data with the one or more physical parameters of the subsurface.

The above discussed method is implemented in a computing system, which is described later. Such a computing system is a specialized tool that includes plural processors configured to operate in parallel while performing these calculations. As the amount of data to be processed is huge, even with the specialized tool, the amount of time necessary for generating a multidimensional image is great. The above discussed embodiments increase the speed of the specialized computer system, for example, by considering during the initial steps of calculations only a subset of waveform coefficients instead of the entire set. Further, the results of the methods discussed in FIGS. 6 and 7 improve the technological field of oil production and reservoir management. In order to increase or maintain the oil or gas output of a reservoir, the operator needs to know when to adjust the injection wells. The image or output provided by the methods noted above offer such a tool to the reservoir's operator.

6.0 Validation of the Method

Re-parameterization and multi-scale methods are generally efficient when the original inverse problem is underdetermined. In order to illustrate the advantages of the approach discussed above, two different medium-to-large test cases are used in this embodiment. The results obtained with the novel multi-scale method (MS-LM-enRML) are compared with the gridblock-based approximate form of the iterative Levenberg-Marquardt ensemble-based randomized maximum likelihood method (GB-LM-enRML) [9] with distance-based localization of the estimated Kalman gain, which proved to be an efficient method for history-matching problems. In both cases, the same criteria are used to stop the algorithm (see Section 5.2). Since the novel algorithm is using the LM-enRML to optimize the wavelet coefficients, the benefits of the multi-scale approach can be assessed from the comparison of the two methods.

The quality of the data match and prediction along with the quality of the updated realizations are used as comparison criteria. The magnitude of the data mismatch in the RML objective function (second term in Eq. 2) is evaluated to ensure that the realizations are possible samples from the posterior:

$$S_{av}(m_j) = \frac{1}{n^e} \sum_{j=1}^{n^e} (g(m_j) - d_j^0)^T C_D^{-1} (g(m_j) - d_j^0), \quad (20)$$

where $d_j^0$ is a realization from the data distribution. If the data mismatch of the realizations is too large, then the likelihood of these being samples from the posterior is nil. When the mismatch is small, the realizations might be samples but further investigations would be necessary to ensure it (see [45]). In any case, it is generally not possible to reach $S_{av} \ll n^{ed}$, even if the uncertainties are overestimated, because the samples $d_j^0$ are physically not consistent as independence of samples is assumed ($C_D$ is diagonal).

The quality of the output realizations is difficult to quantify since most realizations of geological models are generated algorithmically. Consequently, it is not possible to compute the probability that the updated realization is a sample from the posterior. However, spatial analysis of the realizations can provide insight on the behavior of the different inversion processes. For this reason, qualitative examination of the realizations (the "eyeball test") along with variogram analysis is performed in this embodiment.

Because the prior ensemble may incorporate other forms of knowledge, such as seismic and/or geological interpretation, it is generally desirable to minimize the magnitude of changes to the models and, in particular, to avoid spurious updates that do not improve the data match. Average cell-by-cell absolute deviation from prior realizations are also computed using the entire ensemble in order to analyze the magnitude and quality of the changes: for each cell i of the reservoir grid and for each property p, a deviation value $dev_p(i)$ is computed as:

$$dev_p(i) = \frac{1}{n^e} \sum_{j=1}^{n^e} |p^j(i) - p_{pr}^j(i)|, \quad (21)$$

where |x| is the absolute value of x, $p^j(i)$ and $p_{pr}^j(i)$ are the values of the property p of the realization j in the cell i after and before the optimization process, respectively. Deviation from the prior is further summarized by the average deviation $ad_p$ over all the cells:

$$ad_p = dev_p(i) = \frac{1}{n} \sum_{i=1}^{n} dev_p(i), \quad (22)$$

where n is the number of cells. For a similar quality of data match, the smallest deviation to the model is preferred since in that case, the prior information is better preserved and the updates have been less subject to noise.

One of the purposes of these embodiments is to reduce the effects of spurious correlations due to small ensemble size. These spurious correlations result in addition of noise to the realizations. In order to quantify the increase of noise, the energy of the wavelet coefficients is analyzed in a similar manner to the compressed sensing processing [46]. It is defined the energy $e^j$ of a realization j as the L1-norm of its wavelet coefficient vector $\gamma^j$, such that $e^j = \sum_{i=1}^{n} |\gamma^j(i)|$, where $\gamma^j(i)$ is the ith wavelet coefficient of $\gamma^j$. Thus, $$re = \frac{1}{n^e} \sum_{j=1}^{n^e} \frac{e^j}{e_{pr}^j}, \quad (23)$$

is the average ratio of energies (independent of the property type) after and before the optimization. When a small amount of noise is added to the realizations, the energy is unchanged and re takes values around 1. When noise is introduced during the inversion, the energy of the realizations increases and re becomes greater than 1.

Execution times (wall clock times) for both methods are similar as they are mainly controlled by the flow simulations of the ensemble. Wavelets transforms and reconstructions in the multi-scale method require additional computations, but the reduction of parameters helps improve the efficiency of the Levenberg-Marquardt updates. The implementations of the two methods are based on the same source code in order to be comparable, except that in the grid-block case, the wavelet transform is replaced by the identity and the optimization starts at the finest resolution.

Numerical Experiments

Both methods are applied on two history-matching test cases. The first problem is a 2D synthetic reservoir including 13 wells with about 8 years of production history. The first 6 years are used to constrain the inversion, and the remaining 2 years are used to test the prediction of the updated ensembles. The second test case is the well-known 3D Brugge benchmark [47] with 10 years of history, including 30 wells and 9 geologically independents layers. The history-matching takes about 3 h in the first case and about one day in the second for both MS-LM-enRML and GB-LMen-RML methods, flow simulations being simultaneously run on 25 cores.

Wavelets based on average interpolation of a quadratic polynomial (Appendix 3) are used as basis function in all MS-LM-enRML applications. Distance-based localization and control of the Levenberg-Marquardt parameter λ are applied as described in [9] for the GB-LM-enRML, whereas multi-scale localization and control of λ (Sections 5.1 and 5.2) are used for the MS-LM-enRML. In both cases, a spherical covariance function, $f(.)$, is used in the localization functions (Eq. 16).

6.1.2D Reservoir 6.1.1 Presentation of the Problem

Figure 8:
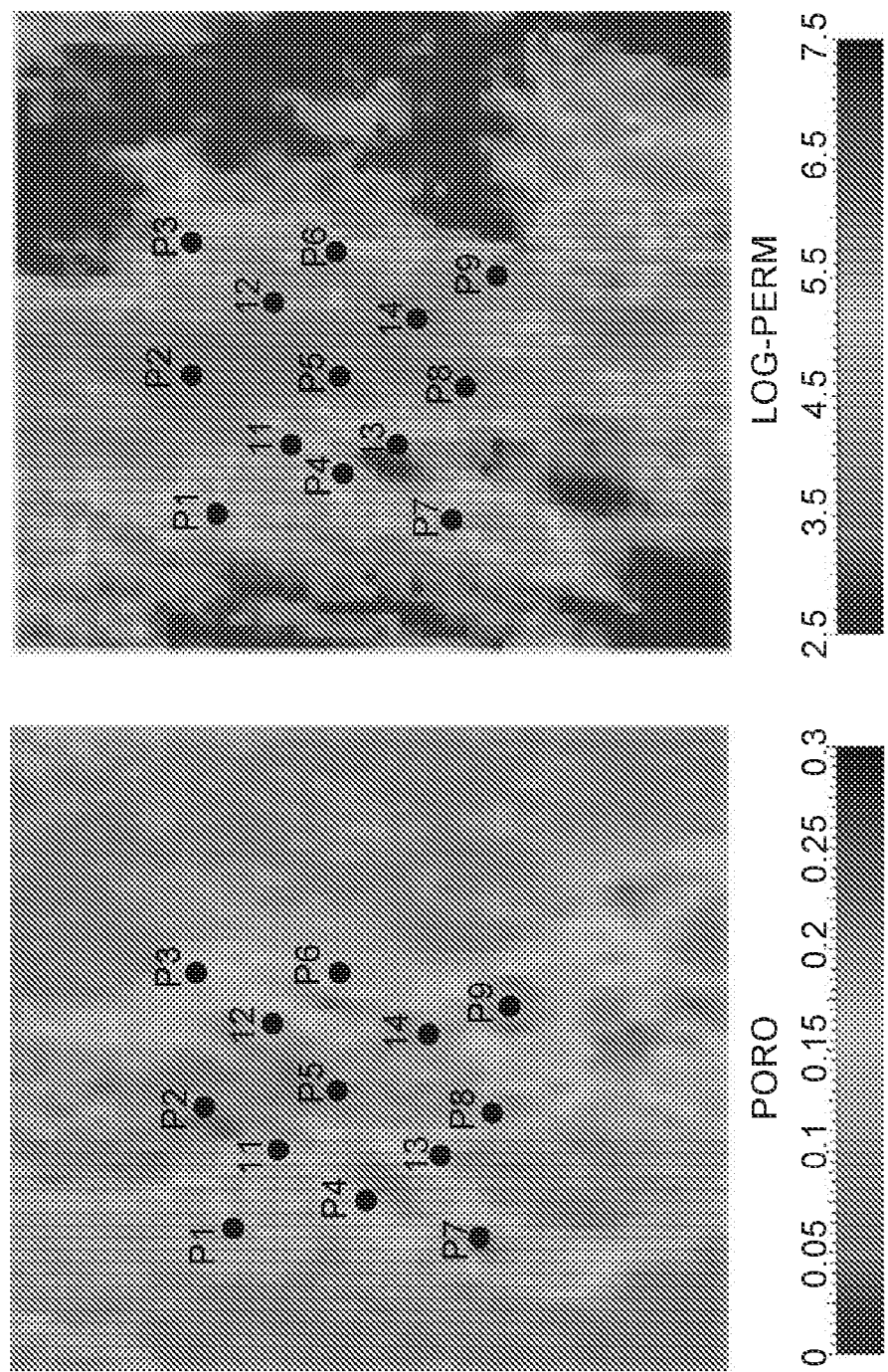
FIG. 8 shows reference porosity and permeability fields.
Figure 11A:
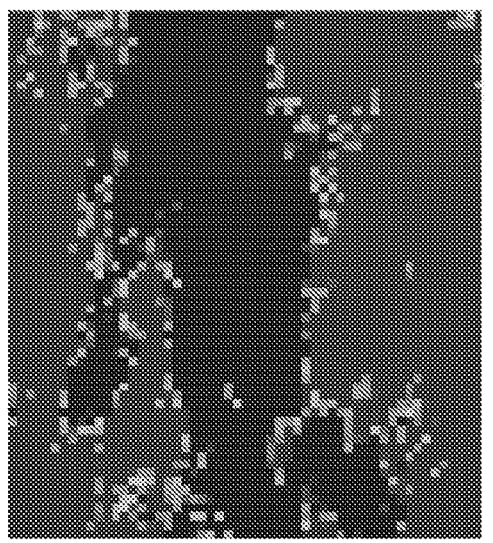
FIGS. 11A-D compare ensemble updated log-permeability averages based on various methods.
Figure 11B:
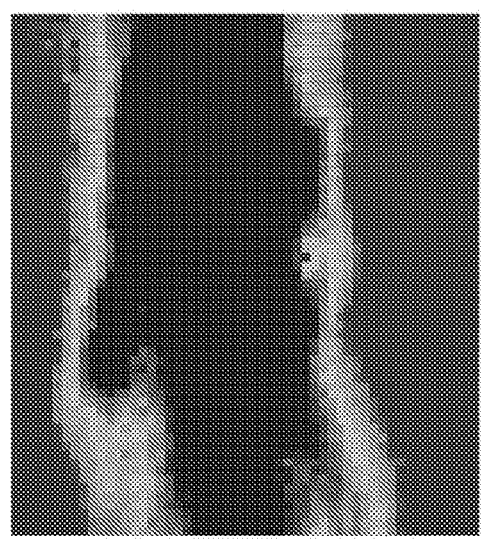
Figure 11C:
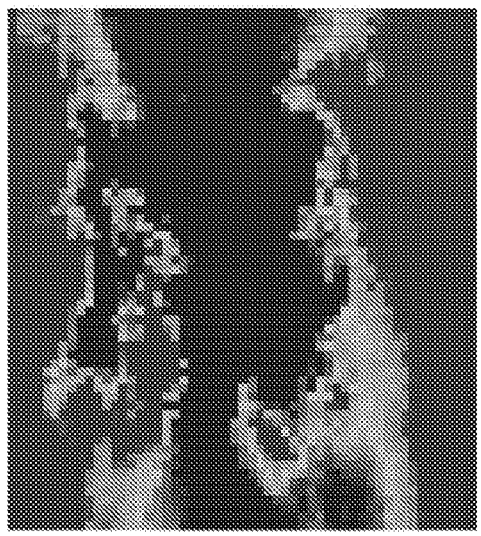
Figure 11D:
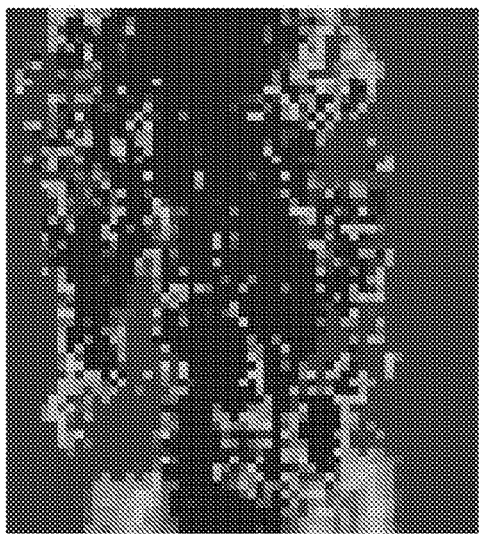

The first test is a 2D synthetic case composed of 3355 active cells which are populated by porosity and permeability fields generated from the blending of object-based simulation and sequential Gaussian simulation (SGS). Properties used to generate the synthetic data set are shown in FIG. 8. A probabilistic non-linear relation is used to generate the permeability field from the porosity. Final distributions of the properties are bimodal, mimicking a channelized system with floodplain deposits.

A total of nine well producers and four well injectors, arranged in a five-spot pattern, are used to generate 8 years of production history. The primary constraints of wells are oil production rates and water injection rates. Bottom hole pressure (BHP) limits of 120 bars are set to all wells. The production scheme includes shut-ins of 1 year at wells P1, P3, P5, and P9 and several buildup periods for all the wells. Producing water cut (WCT), BHP, and gas-oil ratio (GOR) are used to constrain the inversion of the permeability and porosity fields, with a total number of about 700 data points. The standard deviation of noise used for the different data type are 2 bars for BHP, 2.5% for WCT, and 3 sm$^3$/sm$^3$ for GOR.

In both GB- and MS-LM-enRML methods, a maximum number of 20 updates are permitted using an ensemble of 50 realizations conditioned to noisy log data and generated from object-based simulation and SGS. The orientation of the channels is known a priori with an uncertainty of 30°, such that prior models are already constrained by this information. The initial value of the Levenberg-Marquart damping parameter λ is set to 1000 for the two methods. Due to the relatively small size of the problem (compared to real cases), ensembles of only 50 realizations are used during the optimizations.

6.1.2 Application and Comparison of the Multi-Scale Approach

Final results generally depend on the initial ensemble, especially when the ensemble is small. In order to avoid bias in the analysis of the results, five different ensembles are independently used to assimilate the production data using both GB and MS-LM-enRML methods. Note, however, that all the realizations in the different ensembles have been generated using the same process.

FIGS. 9E-F show the evolution of the data mismatch $S_{av}$ for both methods with the five ensembles. In the first iterations, the decrease of the mismatch for the two methods is quite similar even if the MS-LM-enRML uses a reduced parameterization. Only one or two iterations per resolution are performed before reaching the full parameterization (1 iteration from resolutions 1 to 4 and 2 iterations at resolution 5). The re-introduction of smoothed frequency components at the final refinement step sometimes causes a small increase of $S_{av}$ (ensembles 1, 3, and 4), which is rapidly corrected at the next iteration. After reaching the finest resolution, all the groups using the multi-scale approach stop because the mismatch falls into data uncertainties ($S_{av} < n^d$), whereas most of the grid-block cases converge slightly above this value because the mismatch does not improve anymore.

FIGS. 10A-L show initial and final data matches and predictions for wells P1, P2, P6, and P9. Note that it is compulsory to use an iterative scheme in this case as the non-linearity is large and the initial realizations are not spanning the data. The results of ensemble number 4 are used in this comparison as that final data match is the most similar between the two methods. A good match of the data is achieved in both cases. Predictions are also similar, but ensembles sometimes fail to correctly predict the evolution of the production. The performance of prediction can slightly change depending on the method, but the analysis of the results with all the ensembles does not bring out major differences between GB- and MS-LM-enRML.

Figure 12:
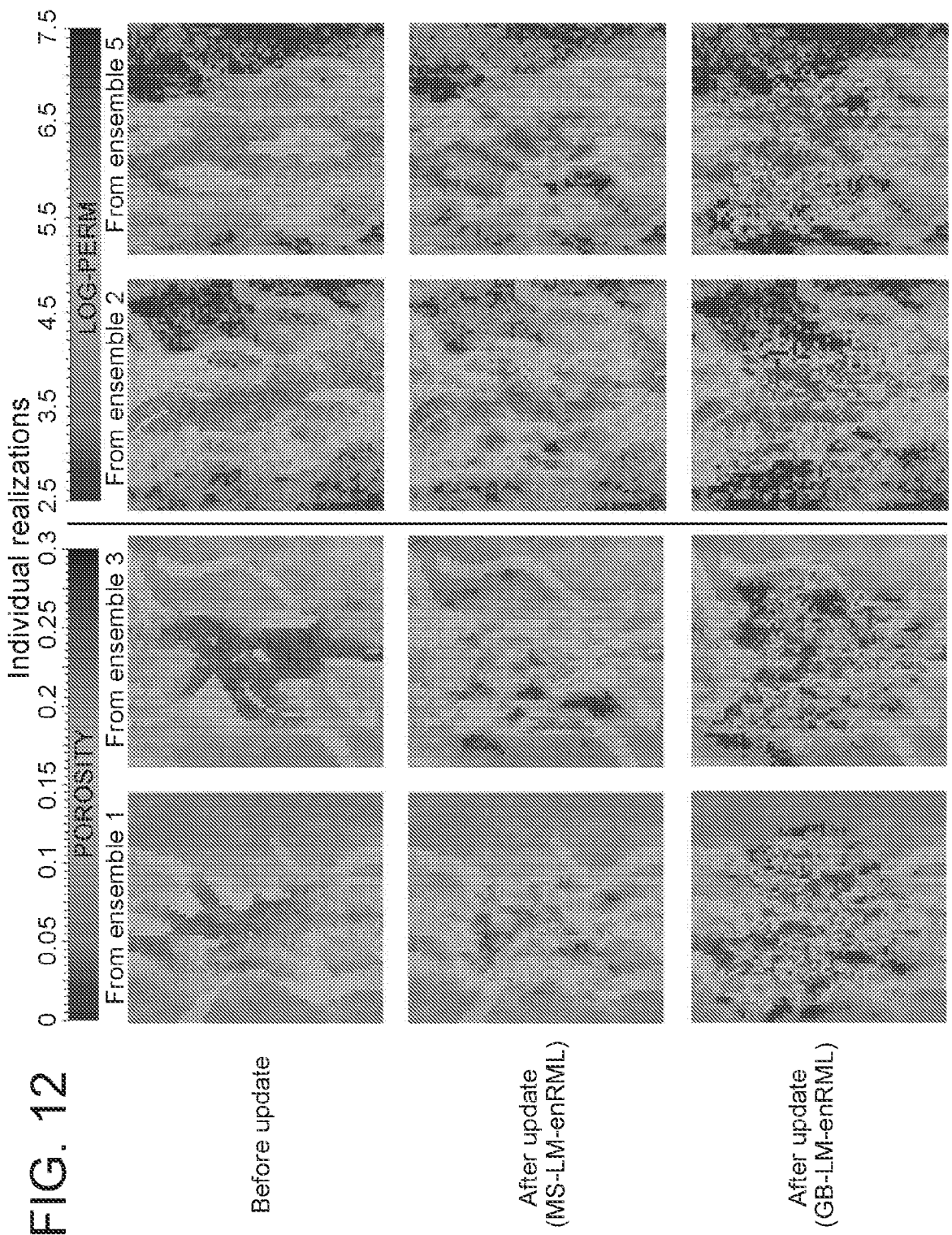
FIG. 12 shows individual porosity and log-permeability realizations before and after production data assimilation.
Figure 13A:
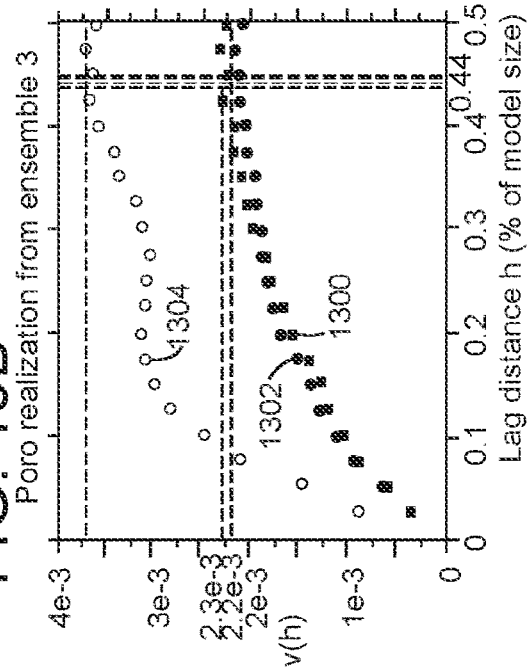
FIGS. 13A-D show variogram analysis of prior and posterior porosity and permeability realizations.
Figure 13B:
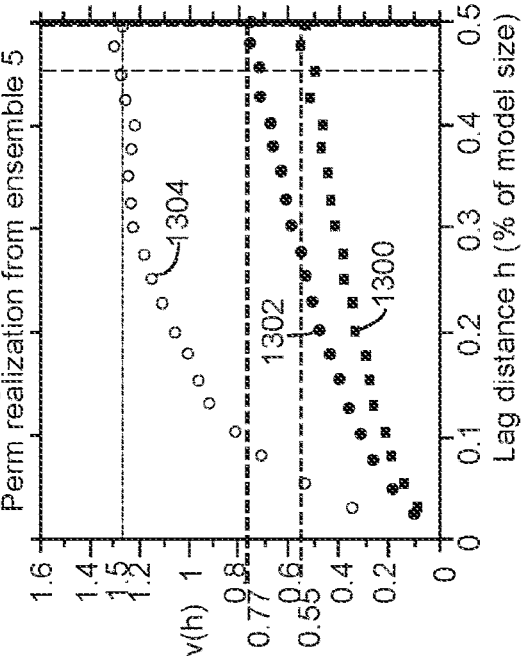
Figure 13C:
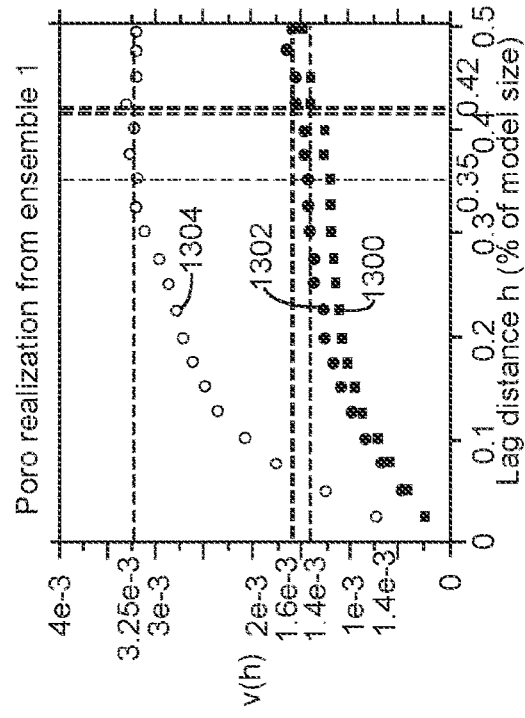
Figure 13D:
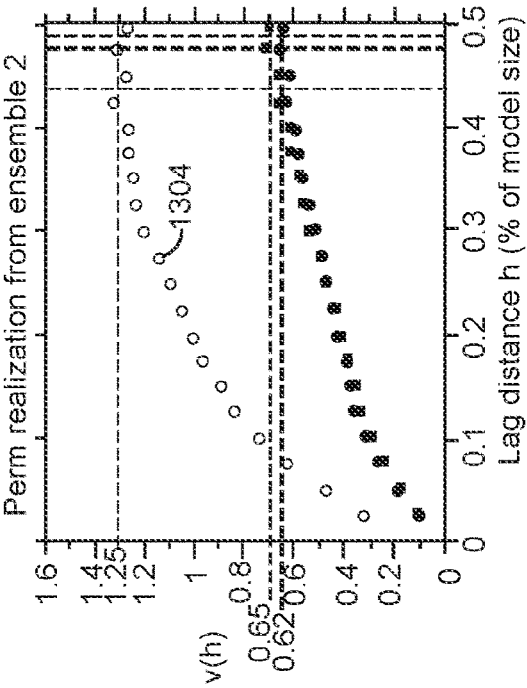

Comparison of output log-permeability averages with the truth is shown in FIGS. 11A-D. The color scale is set such that the main flow structures and property contrast, reflecting the two lithologies present in the field, can be easily identified. In both GB- and MS-enRML cases, the shape of the important flow structures are characterized after assimilation of the production data (e.g., permeable branch on the left). However, one can observe that the property contrasts are better defined and less noisy with the multi-scale approach. FIG. 12 shows a set of individual realizations sampled from the five ensembles before and after assimilation of production data. The final realizations generated using the multi-scale approach better preserve the spatial structure of the prior models and are less noisy while matching the data equally well. Moreover, the important deviations from the prior models are mainly localized where modifications are needed to match the data (i.e., a flow barrier between wells P7 and P8).

FIGS. 13A-D show the variograms, oriented north 0° (orientation of the channels) with a tolerance of 20° and a bandwidth of 20% of the model extension, corresponding to the realizations of FIG. 12. Curve 1300 represents the variogram of the prior realizations, while curves 1302 and 1304 represent the variogram of the posterior realizations with MS-LM-enRML and GB-LMenRML methods, respectively. Vertical and horizontal lines correspond to the interpreted sills and ranges, respectively. Posterior MSLM-enRML variograms remain similar to the prior variograms, whereas GB-LM-enRML variograms are highly affected by the assimilation of the data. Preservation of the properties is only possible because prior models somehow contain prior knowledge (the existence of a channelized system, channel orientation, and log data) which is consistent with the truth. When the prior ensemble is poorly constrained, meaning that no information is used to constrain the realizations, more important perturbations are needed, but the multi-scale approach still helps stabilizing the inversion (see Brugge case, Section 6.2).

6.1.3 Analysis of the Multi-Scale Algorithm

In this section, examples are provided that illustrate the effects of the adapted truncated wavelet parameterization and the localization processes. Three additional cases are run with the same ensemble of 50 realizations used in the previous section: (case 1) the standard GB-LM-enRML without localization, (case 2) the MS-LM-enRML without any localization, and (case 3) the MS-LM-enRML with only localization in the wavelet space (Section 5.1.2). For each of these cases, the control of the Levenberg-Marquart parameter $\lambda$ is applied as described in [9]. Comparison is made with two previous examples: (case 4) GB-LMenRML with localization and (case 5) MS-LM-enRML with space-frequency localization. Details on the localization and optimization controls for cases 4 and 5 are provided in the previous section. The effect of the specific control of $\lambda$ is not presented here as it appears to be negligible for this test case.

All the cases stop after ten iterations and show good matches with the production data. Table 1 gives the values of adp, p∈{log-perm, poro} and re for all five cases. Although the adaptive truncated multi-scale parameterization (case 2) helps limit the increase of energy (noise) as compared to the standard GB-LM-enRML approach (case 1), it does not suppress the effect of the spurious correlations and does not help preserve the prior realizations by itself. After the last refinements, the parameterization includes coefficients that can be incorrectly correlated to the production data. Moreover, the variance of these coefficients is relatively high as they have not been updated during the previous iterations. Thus, the impact of the spurious correlations is important even though the mismatch reduction at the coarse iterations helps limit the amplitude of the perturbations.

TABLE 1

Average cell-by-cell deviation values and energy ratios (see Section 5.3)

|        | $ad_{Poro}$ | $ad_{log-perm}$ | re   |
|--------|-------------|-----------------|------|
| Case 1 | 0.060       | 1.30            | 2.92 |
| Case 2 | 0.060       | 1.16            | 2.30 |
| Case 3 | 0.038       | 0.67            | 1.12 |
| Case 4 | 0.041       | 0.73            | 1.75 |
| Case 5 | 0.029       | 0.47            | 1.15 |

Case 1: GB-LM-enRML without localization.
Case 2: MS-LMenRML without localization.
Case 3: MS-LM-enRML with wavelet localization only.
Case 4: GB-enRML with localization.
Case 5: MSenRML with localization in both the wavelet and grid-block space.
Note that for cases 4 and 5, the values are computed using the five ensembles.

The localization in wavelet space helps limit these spurious updates (case 3), and the increase of the energy is more efficient than the standard grid-block localization (case 4). However, comparable preservations of the prior properties are obtained in cases 3 and 4. As discussed before in Section 5.1.1, this may be caused by an inappropriate modification of the low resolutions (large scales) induced by the conditioning of well production data measured in regions that do not present the same distribution of properties (non-stationary case). By limiting the regions of updates (case 5 with grid-block localization), it is possible to limit the perturbation of the properties, while matching the data.

6.2 Brugge Benchmark Case

The Brugge field case is a (139×48×9) 3D simulation model designed by the Dutch Organization for Applied Scientific Research (TNO). The original geological model is built in a fine resolution grid composed of 20 million gridblocks. A first upscaling of the petro-physical properties is performed in order to generate production data from 30 vertical wells (20 producers and 10 injectors) with a half million grid-block flow model. Only oil and water phases are present in the reservoir. These data are used to test different optimization algorithms on a further upscaled model that contains 44,550 active cells. More information and optimization results can be found in the study of Peters et al. [47]. The primary constraints of the wells are the production rates (FPR) of 2000 bbl/day for the producers and the water injection rate (WIR) of 4000 bbl/day for the injector. Bottom hole pressure limits of 725 psi are set for all wells and is the active constraint of well P9 throughout the 10 years. The data used in this work include bottom hole pressure for the 30 wells, water cuts (WCT), and fluid injection/production rates corresponding to 10 years of history for a total number of about 1330 data points. The standard deviation of noise used for different types of data are 30 psi for BHP, 3.5% for WCT, 2 bbl/day for FPR and WIR if they are active constraint, and 20 bbl/day for FPR of P9. The update parameters are the porosity, lateral and vertical permeabilities, net-to-gross (NTG) ratio, three end points of Corey-type relative permeability curves, and one initial oil-water contact. For the MS-LM-enRML, the wavelets coefficients of the transformed property fields are included in the optimization, whereas grid-blocks values are used in the GB-LM-enRML. Note that mean properties of individual layers are not included in the GB-LM-enRML as in [4, 9] as it can be considered as a part of a multi-scale parameterization. It should, however, improve the results of the GB-LM-enRML. The total number of model parameters for the full parameterization is about 178,200. An ensemble of 104 realizations generated from object-based simulation process and SGS (provided by TNO [47]) is used for all the methods. The initial realizations are poorly constrained and therefore very disparate, making the preservation of the models a more challenging task. Initial Corey end points and initial oil-water contact are generated from uniform distributions defined in [30].

Figure 14A:
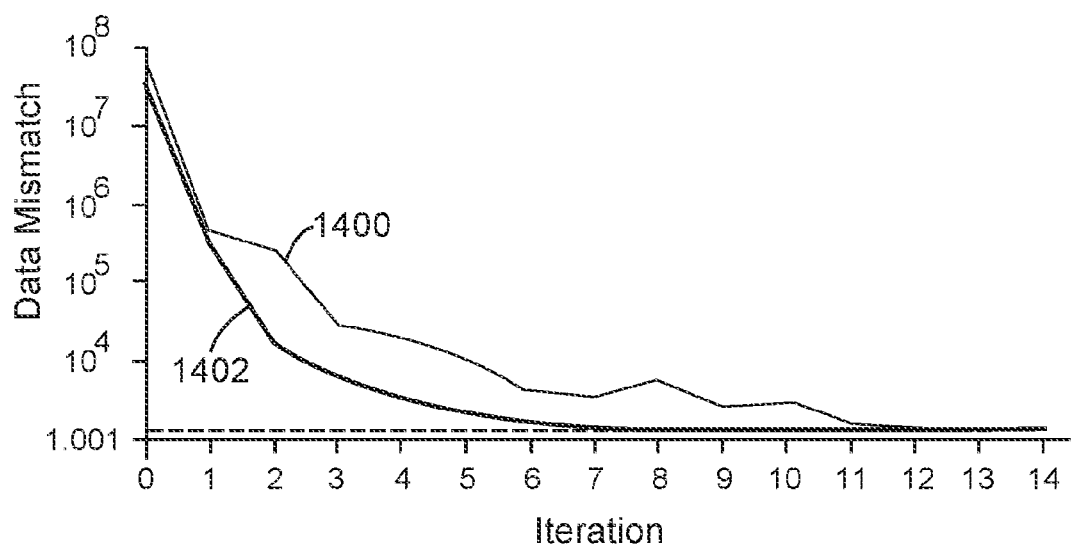
FIGS. 14A-B show evolution of the data mismatch for various methods.
Figure 14B:
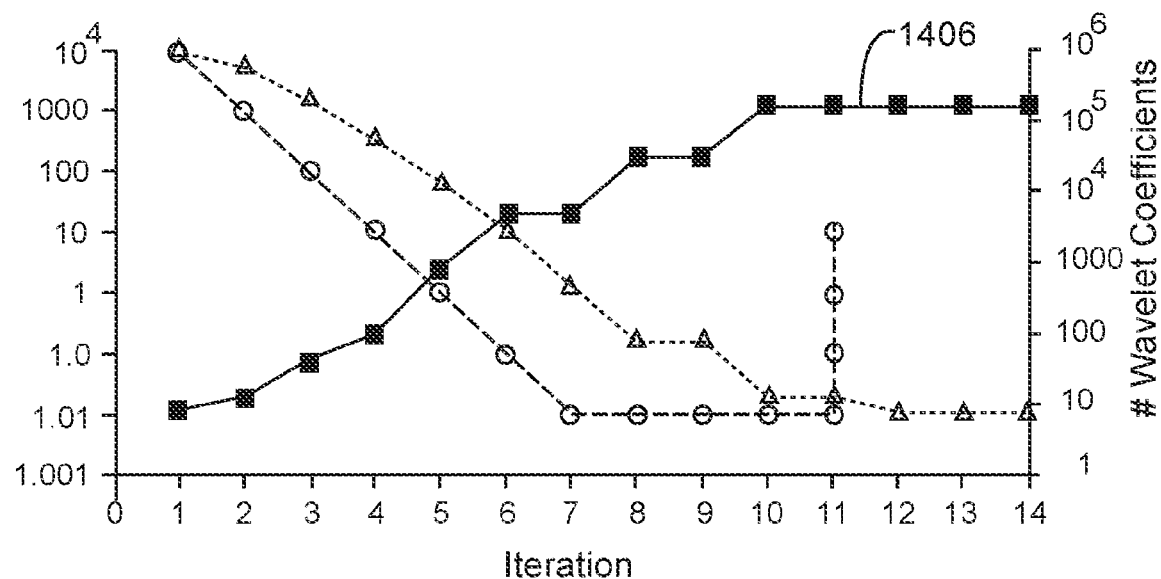

FIGS. 14A-B show the evolution of the objective function (FIG. 14A shows curve 1400 for MS-LM-enRML and curve 1402 for GB-LM-enRML) and the value of the λ parameter (FIG. 14B) with iterations for both methods. The GB-LM-enRML performs better at early iterations and stops with an average data mismatch of 1389 before the MS-LM-enRML because of three unsuccessful updates, whereas the MSLM-enRML stops after 14 iterations as it falls below data uncertainties with an average data mismatch of 1300. In both cases, the initial value of λ is 10,000 and the lower bound is 0.01. At early iterations, only a few parameters are included in the MS-LM-enRML, which explains the difference of efficiency, but a significant improvement of the match is obtained. It can be seen that after the two last refinements, the re-introduction of the smoothed components causes a slight increase of the objective function. The dissimilarity of the prior realizations (generated from different methods without secondary data conditioning) may explain the need of individual gradient after re-introduction of the smoothed components. With the full grid-block parameterization, this effect is attenuated by the linear projection of all the parameters during the first updates, leading to a reduction of the variability at all frequencies, but damaging the prior model at the same time.

FIGS. 15A-I show the initial and final match to bottom-hole pressure, fluid production rate, and water cut at three producers for the MS-LM-enRML and GB-LMenRML. Curves 1500 illustrate the observed data, curves 1502 are the average predictions of the ensemble and curves 1405 are the individual predictions. In both cases, very good matches are obtained and it is not possible to discriminate one method from another.

Average deviations from prior models and energy ratios indicators are also given in Table 2. For an equivalent data match, the multi-scale approach clearly performed more realistic updates by avoiding the appearance of unnecessary high or low property values or addition of noise and minimizing the amplitude of the changes. It can be observed that the energy is decreasing in the MS-LM-enRML case. This might be explained by a smoothing of some of the object-based realizations caused by the Gauss-Newton updates.

By making low frequency (large scale) modifications of the property fields at early iterations, the adaptive multi-scale localization approach ensures that subsequent modifications at the fine scale are relatively small so that the magnitude of spurious high-frequency updates are reduced and features of the initial property field are better preserved.

TABLE 2

Average cell-by-cell deviation values and energy ratios for the Brugge case (see Section 5.3)

| | $ad_{Poro}$ | $ad_{log\text{-}perm}$ | re |
|---|---|---|---|
| GB-LM-enRML | 0.010 | 0.710 | 1.180 |
| MS-LM-enRML | 0.008 | 0.450 | 0.940 |

GB-LM-enRML grid-block approach with distance based localization,
MS-LM-enRML multi-scale approach with space-frequency localization

7. DISCUSSIONS AND CONCLUSIONS

The adaptive multi-scale method based on second-generation wavelet parameterization appears to be useful for stabilizing the inversion and avoiding spurious effects related to ensemble-based optimization methods. In the examples presented here, a better preservation of the prior is obtained with the multi-scale approach compared to the grid-block-LM-enRML, while matching the production data equally well. However, the novel multi-scale approach is based on the assumption that the flow is more affected by the low- than the high-frequencies. In reservoirs, where the fluid flow is mainly controlled by fine-scale structures (e.g., fractured or laminated reservoirs), the multi-scale approach might fail to recover the correct structure of the reservoir. In this case, it might be useful to include high frequencies from the beginning of the optimization (e.g., for laminated reservoirs, individual 2D transforms can be used for each layers).

The multi-scale approach and the smoothing of the realizations tend to make the problem more linear by attenuating the effects of the high frequencies and reducing the number of parameters at early stage [48]. Global updates of the property fields are then possible without the influence of small-scale spurious correlations. Significant mismatch reduction is obtained by optimizing only few large-scale parameters at the first iterations, resulting in smaller perturbations of the finer scales after refinements. However, inter-scales re-introduction of the a priori smoothed components may slightly affect the convergence as compared with the standard approach. In the current implementation of the algorithm, the smoothing simply depends on the resolution of the parameters. However, a more advanced initial smoothing, based on the localization of the parameters and/or prior uncertainties, might be more efficient. Indeed, smoothing should first be applied on sensitive high-frequencies (e.g., close to wells) and becomes less essential in insensitive areas. Moreover, when the uncertainty of the model has already been reduced by integration of other sources of data, the smoothing should be less important since the different realizations are more similar. The flow impact of certain features of the prior model should also be taken into account during the first updates, assuming that the different sources of information are consistent.

The regularization of the Kalman gain using localization can be a fairly complex task and a wrong localization can lead to inconsistent updates and insufficient data match. With the multi-scale approach, the effect of the localization at early iterations is limited because only sensitive parameters are included in the optimization. However, when the prior model contains information at all frequencies, it is generally required to refine the parameterization to the finest level and the need for regularization becomes essential. For this reason, a localization of the wavelet coefficients, depending on their location and associated frequency, is applied in this document to stabilize the inversion and preserve prior information. Nevertheless, similarly to the grid-block localization, the implementation of the regularization in the wavelet space is not always trivial. Further analysis based on cross-covariance matrices [29] or boot-strap sampling [33] might help define more appropriate multi-scale localization functions.

Preserving the prior information is one of the goal of this method, and the multi-scale approach helps restrict the updates to sensitive areas. Qualitative comparisons and quantitative spatial analysis are used in these embodiments to check this preservation. When the prior ensemble integrates quantitative information, such as seismic data, it might be suitable to perform posterior quality controls using these data. This process, however, might not be straightforward as the different data might be expressed in different domains (time/depth) and sampling intervals.

If little information is used to generate the prior ensemble, the successive re-introduction of the initial smoothed frequencies may affect the efficiency of the optimization, especially when the realizations are disparate, as the local quadratic approximation of the objective function might not be appropriate for each individual realization of the ensemble. In this case, methods using full parameterization might be more efficient in term of convergence speed, but wavelet re-parameterization might still be useful in identifying sensitive parameters for regularization or to avoid over-parameterization and addition of noise.

APPENDIX 1: LIFTING SCHEME

In the following, it is considered an original signal $\lambda_{r,k}$, defined at a finer scale r in all spatial locations k. The construction of the second generation wavelets is based on the lifting scheme [37], which is composed of three main reversible operators: split, predict, and update. It should be made clear that these operators are not related to the enKF update and prediction steps.

First, the splitting operator, S, subdivides the initial set $\lambda_{r,k}$ into two different subsets. The correlation between the two subsets should be maximized. Usually, the subdivision is simply done between odd and even samples as neighbors have more chances to be correlated. A new sequence $\lambda_{r-1,k}$ at resolution r-1 is obtained by taking the even samples:

$$\lambda_{r-1,k}^* = \lambda_{r,2k}. \tag{24}$$

The loss of information is conserved in the odd samples, which correspond to the detail coefficients:

$$\gamma_{r-1,k}^* = \lambda_{r,2k+1}. \tag{25}$$

At this step, the algorithm performs a poor decorrelation of the signal and leads to aliasing effects. Proper decorrelation and subsampling are handled by the predict and update operators. The predict step, P, uses the correlation between the odd and even subsets. The basic idea is to try to predict the odd samples by only using the even samples. Generally, the predict step must be independent of the data values in order to remain reversible. The predicted value is then subtracted from the original odd sample, such as:

$$\gamma_{r-1,k} = \gamma_{r-1,k}^* - P(\lambda_{r-1,k}^*). \tag{26}$$

The detail coefficients $\gamma_{r-1,k}$ reflect how good the prediction is. The aim of the predict step is to produce detail coefficients as small as possible. In this case, the original signal would be well characterized only with the subsampled coefficients. The predict step conditions the quality of the decomposition. Any prediction operators can be used and specific predictors can be built for specific applications, for example, taking into account the sampling of the data (Appendix 2) or external weights [38]. The predict step produces a set of filter coefficients, which are adapted to the localization of the data.

At this stage, the subsamples $\lambda_{r-1,k}^*$ have not been modified and are not necessarily representative of the original signal and strong aliasing problems could appear. It is often desirable to preserve some properties of the original data, such as the mean, at different scales. This is done by the update operator U. The update operator can be compared to the action of the scaling functions in the case of first generation wavelets since it produces a coarser version of an original signal. The detail coefficients $\gamma_{r-1,k}$ are used to update the values of the sub-sampled signal:

$$\lambda_{r-1,k} = \lambda_{r-1,k}^* + U(\gamma_{r-1,k}). \tag{27}$$

The update step maintains the moments (mean, first moment, . . . ) of the sequences $\lambda_r$ up to an order equal to the number of samples used in the prediction step. A set of coefficients, known as lifting coefficients, are deduced from the preservation of the moments. An efficient method of computation can be found in [49] in the case of polynomial interpolating scaling functions. The complete wavelet transform is performed by recursively applying the lifting scheme to the samples $\lambda_r$ (similarly to FIG. 2) until the number of samples at one scale becomes smaller than the number of samples needed in the prediction step.

APPENDIX 2: GRID-ADAPTIVE HAAR TRANSFORM

Grid-adapted Haar transform integrates the grid cell volumes in the prediction and update steps in order to compute a weighted average sequence. This transform, also called the unbalanced Haar transform, is the generalization of the Haar wavelet to the second-generation setting [50]. It belongs to the class of wavelets based on average interpolating subdivision (Appendix 3). Values $\lambda_{r,k}$ of every sequence in the decomposition represent an average over an interval $[x_{r,k}, x_{r,k+1}]$. In the 3D discrete wavelet transform, it can be useful to associate each $\lambda_{r,k}$ as average of a grid volume $V_{r,k}$. Before wavelet transform, the weights $V_{r,k}$ are the cell volumes of the grid and it directly follows that, $$V_{r-1,k} = V_{r,2k} + V_{r,2k+1}. \tag{28}$$

The aim of the unbalanced Haar wavelet is to preserve the weighted average:

$$\lambda_{r-1,k} = \frac{V_{r,2k} \cdot \lambda_{r,2k} + V_{r,2k+1} \cdot \lambda_{r,2k+1}}{V_{r-1,k}}. \quad (29)$$

The lifting scheme version of the unbalanced Haar wavelet starts exactly like the classical Haar wavelet. The splitting operator divides the odd and even samples. The prediction step uses only one even sample to predict the odd. The only polynomial which can be constructed is the constant polynomial. Therefore, the prediction operator returns the even sample value and the detail coefficient is given by, $$\gamma_{r-1,k} = \lambda_{r,2k+1} - \lambda_{r,2k}. \quad (30)$$

The update step preserves the weighted average by the such as $$\lambda_{r-1,k} = \lambda_{r,2k+1} + \frac{V_{r,2k+1} \times \gamma_{r-1,k}}{V_{r-1,k}} = \quad (31)$$

$$\frac{(V_{r,2k} + V_{r,2k+1})\lambda_{r,2k} + V_{r,2k+1}(\lambda_{r,2k+1} - \lambda_{r,2k})}{V_{r-1,k}} =$$

$$\frac{V_{r,2k} \cdot \lambda_{r,2k} + V_{r,2k+1} \cdot \lambda_{r,2k+1}}{V_{r-1,k}}$$

Instead of computing each weight $V_{r,k}$ directly from the grid during the decomposition and reconstruction, a usual Haar transform of the cell volume property can be performed in parallel of the unbalanced Haar transform.

The unbalanced Haar wavelet is useful when the sampling is irregular, which is typically the case in realistic geo-models where the cell volumes can vary a lot. Moreover, this transform can handle the presence of dead cells (inactive or zero volume cells) without increasing the number of active parameters.

APPENDIX 3: WAVELETS BASED ON AVERAGE-INTERPOLATING SUBDIVISION

Average-interpolating subdivision is based on the idea that samples of a given sequence $\lambda_{r,k}$ are not subsamples of an original signal but are local averages over intervals.

Therefore, for a given sequence to reconstruct, using the coarse sequence of $\lambda_{r-1,k}$ a prediction operator models the underlying integrated function in order to interpolate the samples at a finer scale. If the underlying function is a polynomial, its primitive will also be a polynomial. In a first time, the prediction step will find this primitive. Using this primitive, it is then possible to find, for a given coarse sample, the two samples of the signals at the finer scale, which follow the underlying polynomial. Then, the difference of these two samples is given to the Haar reconstruction. If the detail coefficient is null, the Haar reconstruction will reform the modeled polynomial, which will produce a smooth transition (see [38] for more details). The Haar transform ensures that local averages of the property are preserved at coarse scales. If the unbalanced Haar wavelet is used, the weighted average is preserved which leads to a better upscaled property.

APPENDIX 4: ALGORITHM

Algorithms that incorporate the mathematics discussed above for updating the wavelet coefficients and calculating the fine ensemble are now illustrated below.

---

Algorithm 1: The Multi-Scale Lm-enRML algorithm. For sake of simplicity, only spatial variables are considered here, which simplifies the transformation of the ensemble of parameters

---

Input: Mpr, $d_{obs}$, $r_0$, $A^{gb}$, $A^{wt}$, $\omega_0$, $\epsilon_s$
Output: $M^{up}$
begin initialization
  $r \leftarrow r_0$;
  $l = 1$; SFact = 1;
  $D^0 \leftarrow d_{obs} + \epsilon$, with $\epsilon \sim N(0, C_D)$;
  $\Gamma_0 \leftarrow W \cdot M^{pr}$;
  $I_r \leftarrow \{i\gamma\}_{0,r_0}$; // Initial set of coef. indices
  $n^* \leftarrow |I_r|$; // Cardinality of the set
  $S_r \leftarrow S_0$; // Initial smoothing
  $\Gamma^s \leftarrow S_r \circ \Gamma_0$;
  $\Gamma^* \leftarrow \Gamma^s [q(I_r), *]$; // Sub-matrix of $\Gamma^s$
  $D_0 \leftarrow g(W^{-1} \cdot \Gamma^s)$; $Sav_0 \leftarrow (D_0 - D^0)^T C_D(D_0 - D^0)$;
  $Sav_{r_0} \leftarrow Sav_0$;
  $\lambda \leftarrow 10^{Floor(log_{10}(\frac{Sav_0}{2N^d}))}$; $\omega_{r_0} \leftarrow \omega_0$;
end
while $r \leq N^r$ do
  while $l \leq l_r^{max}$ do
    if $l = 1$ and $r \neq r_0$ then Algorithm 2
      Refinement($\Gamma_{r-1}^s$, $I_{r-1}$, $S_{r-1}$, SFact, $\epsilon_s$);
    end
    $K \leftarrow$ KalmanGain($\Gamma_l^*$, $D_l$, $\lambda l$); // see [15]
    $K \leftarrow$ MSLocalization(K, $A_r^{gb}$, $A^{wt}$, $l_r$);
    // Algorithm 3
    $\delta\Gamma^* \leftarrow -K(D_l - D^0)$;
    $\Gamma_l^* \leftarrow \Gamma_{l-1}^* + \delta\Gamma^*$; $D_l \leftarrow g(\Gamma^s)$;
    $Sav_l = (D_l - D^0)^T C_D(D_l - D^0)$;
    if $Sav_l \leq Sav_{l-1}$ then
      SFact = 1; $l = l + 1$;
      if StopCriteria(r, $Sav_l$) then
        Break;
      else
        $\lambda_{l+1} \leftarrow \lambda_l/\omega_r$;
      end
    else
      if $l = 1$ and $r - 2 \leq r_0$ then post refinement special case
        if $Sav_l \leq Sav_{r-2}$ then
          $l = l + 1$; SFact = 1;
        else
          $\lambda_l \leftarrow \lambda_l \times \omega_r$;
          $D_l \leftarrow D_{l-1}$;
          SFact = SFact/2;
        end
      else
        $\lambda_l \leftarrow \lambda_l \times \omega_r$;
        $\Gamma_l^* \leftarrow \Gamma_{l-1}^*$;
        $D_l \leftarrow D_{l-1}$;
      end
    end
  end
  $Sav_r \leftarrow Sav_{l-1}$; $Sav_0 \leftarrow Sav_{l-1}$;
  $D_0 \leftarrow D_{l-1}$;
  $\omega_{r+1} \leftarrow \omega_r + \frac{10 - \omega_{r_0}}{r_{max} - r_0}$;
  $r = r + 1$; $l = 1$;
end

---

Algorithm 2: Refinement function

---

Input: $\Gamma_{r-1}^s$, $I_{r-1}$, $S_{r-1}$, SFact, $\epsilon_s$
Output: $\Gamma_r^s$, $I_r$, $S_r$
$I_r \leftarrow I_{r-1} \cup \{i\gamma\}_r$; $n^* \leftarrow |I_r|$;
$S_{tmp}[n^*, n^e]$; // Temporary matrix
for $e = 1$ to $e = n^e$ do
  for $p = 1$ to $p = n$ do partial re-introduction for all frequencies
    $S_{tmp}(p, e) = \min(S_{r-1}(p, e)^{-1}, \epsilon_s)/$SFact;
  end
  forall the $p \in I_r$ do
    $S_{tmp}(p, e) = S_{r-1}(p, e)^{-1}/$SFact;

```
    end
  end
  r_r^s ← S_tmp ∘ Γ_{r-1}^s;
  S_r ← S_tmp ∘ S_{r-1};
```

Algorithm 3: MSLocalization: multi-scale Kalman Gain Localization function

```
Input: K, A_r^{gb}, A_r^{wt}, I_r
Output: K
K = A_r^{wt} ∘ K; // Localization in wavelet space
K^{gb} ← zeros(n, n^e); // Temporary Kalman gain
for d = 1 to d = n^d do
    forall the p ∈ I_r do
        K^{gb}(p,d) = K(p,d);
    end
end
K^{gb} = W^{-1} · K^{gb};
K^{gb} = W · (A_r^{gb} ∘ K^{gb});
K ← K^{gb} [q(I_r),*] ; // extract sub-matrix
```

Figure 16:
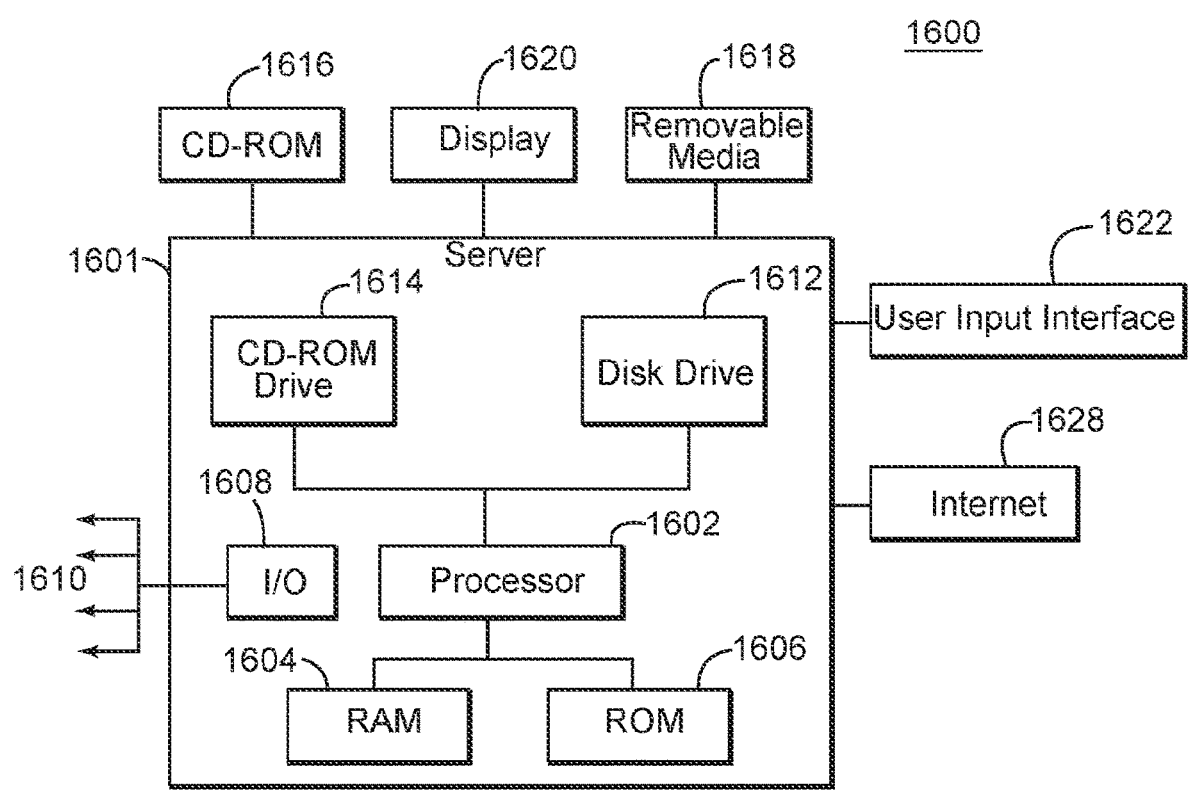
FIG. 16 is a schematic diagram of a computing system that implements one or all of the above methods.

The above method and others may be implemented in a computing system specifically configured to calculate the image of the subsurface. An example of a representative computing system capable of carrying out operations in accordance with the exemplary embodiments is illustrated in FIG. 16. Hardware, firmware, software or a combination thereof may be used to perform the various steps and operations described herein.

The exemplary computing system 1600 suitable for performing the activities described in the exemplary embodiments may include a server 1601. Such a server 1601 may include a central processor (CPU) 1602 coupled to a random access memory (RAM) 1604 and to a read-only memory (ROM) 1606. The ROM 1606 may also be other types of storage media to store programs, such as programmable ROM (PROM), erasable PROM (EPROM), etc. The processor 1602 may communicate with other internal and external components through input/output (I/O) circuitry 1608 and bussing 1610, to provide control signals and the like. The processor 1602 carries out a variety of functions as are known in the art, as dictated by software and/or firmware instructions.

Server 1601 may also include one or more data storage devices, including a hard drive 1612, CD-ROM drives 1614, and other hardware capable of reading and/or storing information such as DVD, etc. In one embodiment, software for carrying out the above-discussed steps may be stored and distributed on a CD- or DVD-ROM 1616, removable memory device 1618 or other form of media capable of portably storing information. These storage media may be inserted into, and read by, devices such as the CD-ROM drive 1614, the disk drive 1612, etc. Server 1601 may be coupled to a display 1620, which may be any type of known display or presentation screen, such as LCD, LED displays, plasma displays, cathode ray tubes (CRT), etc. A user input interface 1622 is provided, including one or more user interface mechanisms such as a mouse, keyboard, microphone, touchpad, touch screen, voice-recognition system, etc.

Server 1601 may be coupled to other computing devices, such as landline and/or wireless terminals, via a network. The server may be part of a larger network configuration as in a global area network (GAN) such as the Internet 1628, which allows ultimate connection to various landline and/or mobile client devices. The computing device may be implemented on a vehicle that performs a land seismic survey.

The disclosed exemplary embodiments provide a system and a method for calculating an image of a reservoir. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

1. Evensen, G.: The ensemble Kalman filter: theoretical formulation and practical implementation. Ocean Dyn. 53(4), 343-367 (2003)
2. Aanonsen, S. I., Nvdal, G., Oliver, D. S., Reynolds, A. C., Vall`es, B.: The ensemble Kalman filter in reservoir engineering—a review. SPE J. 14(3), 393-412 (2009)
3. Oliver, D. S., Chen, Y.: Recent progress on reservoir history matching: a review. Comput. Geosci. 15(1), 185-221 (2011)
4. Chen, Y., Oliver, D. S.: Multiscale parameterization with adaptive regularization for improved assimilation of non-local observation. Water Resour. Res. 48(4) (2012)
5. Bhark, E., Jafarpour, B., Datta-Gupta, A.: An adaptively scaled frequency-domain parameterization for history matching. J. Pet. Sci. Eng. 75(3-4), 289-303 (2011)
6. Sahni, I., Horne, R.: Multiresolution wavelet analysis for improved reservoir description. SPE Reserv. Eval. Eng. 8(1), 53-69 (2005)
7. Soubaras, R., Dowle, R.: Variable-depth streamer—a broadband marine solution. first break 28(12) (2010)
8. Gu, Y., Oliver, D. S.: An iterative ensemble Kalman filter for multiphase fluid flow data assimilation. SPE J. 12(4), 438-446 (2007)
9. Chen, Y., Oliver, D. S.: Levenberg-marquardt forms of the iterative ensemble smoother for efficient history matching and uncertainty quantification. Comput. Geosci. 17(4), 689-703 (2013)
10. Ben Ameur, H., Chavent, G., Jaffr'e, J.: Refinement and coarsening indicators for adaptive parameterization: application to the estimation of hydraulic transmissivities. Inverse Probl. 18(3), 775 (2002)
11. Grimstad, A. A., Mannseth, T., Nvdal, G., Urkedal, H. A.: Adaptive multiscale permeability estimation. Comput. Geosci. 7(1), 1-25 (2003)

12. Ben Ameur, H., CL'ement, F., Weis, P., Chavent, G.: The multidimensional refinement indicators algorithm for optimal parameterization. J. Inverse Ill-Posed Probl. 16(2), 107-126 (2008)
13. Lu, P., Home, R.: A multiresolution approach to reservoir parameter estimation using wavelet analysis. In: SPE annual technical conference and exhibition (2000)
14. Bhark, E., Rey, A., Datta-Gupta, A., Jafarpour, B.: A multiscale workflow for history matching in structured and unstructured grid geometries. SPE J. 17(3), 828-848 (2012)
15. Bhark, E., Datta-Gupta, A., Jafarpour, B.: Subsurface flow model calibration with a spectral-domain parameterization adaptive to grid connectivity and prior model information. Math. Geosci. 44(6), 673-710 (2012)
16. Liu, J.: A multiresolution method for distributed parameter estimation. Sci. Comput. 14(2), 389-405 (1993)
17. Mannseth, T.: Permeability identification from pressure observations: some foundations for multiscale regularization. Multiscale Model. Simul. 5(1), 21-44 (2006)
18. Chavent, G.: Nonlinear least squares for inverse problems: theoretical foundations and step-by-step guide for applications. Springer Verlag (2009)
19. Lien, M., Brouwer, D., Mannseth, T., Jansen, J.-D.: Multiscale regularization of flooding optimization for smart field management. SPE J. 13(2), 195-204 (2008)
20. Gardet, C., Ravalec, M., Gloaguen, E.: Multiscale parameterization of petrophysical properties for efficient history-matching. Math. Geosci., 1-22 (2013)
21. Reynolds, A. C., He, N., Chu, L., Oliver, D. S.: Reparameterization techniques for generating reservoir descriptions conditioned to variograms and well-test pressure data. SPE J. 1(4), 413-426 (1996)
22. Efendiev, Y., Hou, T., Luo, W.: Preconditioning Markov chain Monte Carlo simulations using coarse-scale models. SIAM J. Sci. Comput. 28(2), 776-803 (2006)
23. Jafarpour, B., McLaughlin, D.: Reservoir characterization with the discrete cosine transform. SPE J. 14(1), 182-201 (2009)
24. Li, L., Jafarpour, B.: A sparse Bayesian framework for conditioning uncertain geologic models to nonlinear flow measurements. Adv. Water Resour. 33(9), 1024-1042 (2010)
25. Bhark, E. W., Jafarpour, B., Datta-Gupta, A.: A generalized grid connectivity-based parameterization for subsurface flow model calibration. Water Resour. Res. 47(6) (2011)
26. Feng, T., Mannseth, T.: Improvements on a predictor-corrector strategy for parameter estimation with several data types. Inverse Probl. 25(10), 105012-105032 (2009)
27. Hamill, T. M., Whitaker, J. S., Snyder, C.: Distance-dependent filtering of background error covariance estimates in an ensemble Kalman filter. Mon. Weather Rev. 129(11), 2776-2790 (2001)
28. Houtekamer, P. L., Mitchell, H. L.: A sequential ensemble Kalman filter for atmospheric data assimilation. Mon. Weather Rev. 129(1), 123-137 (2001)
29. Chen, Y., Oliver, D. S.: Cross-covariances and localization for EnKF in multiphase flow data assimilation. Comput. Geosci. 14, 579-601 (2010)
30. Chen, Y., Oliver, D. S.: Ensemble-based closed-loop optimization applied to Brugge field. SPE Reserv. Eval. Eng. 13(1), 56-71 (2010)
31. Furrer, R., Bengtsson, T.: Estimation of high-dimensional prior and posterior covariance matrices in Kalman filter variants. J. Multivar. Anal. 98(2), 227-255 (2007)
32. Anderson, J. L.: Exploring the need for localization in ensemble data assimilation using a hierarchical ensemble filter. Phys. D: Nonlinear Phenom. 230(1-2), 99-111 (2007)
33. Zhang, Y., Oliver, D. S.: Improving the ensemble estimate of the Kalman gain by bootstrap sampling. Math. Geosci. 42(3), 327-345 (2010)
34. Grossmann, A., Morlet, J.: Decomposition of hardy functions into square integrable wavelets of constant shape. SIAM J. Math. Anal. 15(4), 723-736 (1984)
35. Mallat, S. G.: A theory for multiresolution signal decomposition: the wavelet representation. Pattern Anal. Mach. Intell., IEEE Trans. 11(7), 674-693 (1989)
36. Burrus, C. S., Gopinath, R. A., Guo, H., Odegard, J. E., Selesnick, I. W.: Introduction to wavelets and wavelet transforms: a primer, vol. 23. Prentice hall Upper Saddle River (1998)
37. Sweldens, W.: The lifting scheme: a construction of second generation wavelets. SIAM J. Math. Anal. 29(2), 511-546 (1998)
38. Sweldens, W., Sch¨oder, P.: Building your own wavelets at home. In: Klees, R., Haagmans, R. (eds.) Wavelets in the Geosciences of Lecture Notes in Earth Sciences, vol. 90, pp. 72-107. Springer, Berlin, Heidelberg (2000)
39. Chen, Y., Oliver, D. S.: Ensemble randomized maximum likelihood method as an iterative ensemble smoother. Math. Geosci. 44(1), 1-26 (2012)
40. Liu, N., Oliver, D. S.: Evaluation of Monte Carlo methods for assessing uncertainty. SPE J. 8(2), 188-195 (2003)
41. Gao, G., Zafari, M., Reynolds, A. C.: Quantifying uncertainty for the PUNQ-S3 problem in a Bayesian setting with RML and EnKF. SPE J. 11(4), 506-515 (2006)
42. Golub, G. H., Van Loan, C. F.: Matrix Computations, 2nd edn. Johns Hopkins University Press, Baltimore (1989)
43. Li, R., Reynolds, A. C., Oliver, D. S.: History matching of threephase flow production data. SPE J. 8(4), 328-340 (2003)
44. Iglesias, M. A., Dawson, C.: The regularizing Levenberg-Marquardt scheme for history matching of petroleum reservoirs. Comput. Geosci. 17(6), 1033-1053 (2013)
45. Oliver, D. S., Reynolds, A. C., Liu, N.: Inverse theory for petroleum reservoir characterization and history matching. Cambridge University Press (2008)
46. Donoho, D.: Compressed sensing. Inf. Theory, IEEE Trans. 52, 1289-1306 (2006)
47. Peters, L., Arts, R., Brouwer, G., Geel, C., Cullick, S., Lorentzen, R., Chen, Y., Dunlop, N., Vossepoel, F., Xu, R., et al.: Results of the Brugge benchmark study for flooding optimization and history matching. SPE SPE Reserv. Eval. Eng. 13(3), 391-405 (2010)
48. Grimstad, A.-A., Mannseth, T.: Nonlinearity, scale, and sensitivity for parameter estimation problems. SIAM J. Sci. Comput. 21(6), 2096-2113 (2000)
49. Fernandez, G., Periaswamy, S., Sweldens, W.: LIFT-PACK: A software package for wavelet transforms using lifting. Proc. SPIE 2825,396 (1996)
50. Girardi, M., Sweldens, W.: A new class of unbalanced Haar wavelets that form an unconditional basis for Lp on general measure spaces. J. Fourier Anal. Appl. 3(4), 457-474 (1997).

What is claimed is:

1. A method for generating a multidimensional image of a subsurface of the earth, the method comprising:
   receiving data related to the subsurface of the earth;
   generating an ensemble of realizations associated with the subsurface based on the received data;
   applying wavelet re-parameterization to spatial properties of members of the ensemble to calculate a set of wavelet coefficients;
   reconstructing spatial properties of the ensemble based on a subset of the wavelet coefficients that correspond to a large scale;
   applying a forward simulator to the reconstructed spatial properties of the ensemble for estimating one or more physical parameters of the subsurface;
   applying an ensemble-based optimization method to update the subset of the wavelet coefficients; and
   generating the multidimensional image of the subsurface based on the updated subset of the wavelet coefficients,
   wherein the method further comprises:
   refining the subset of the wavelet coefficients by adding non-included coefficients that belong to the set but not the subset, and
   attenuating the non-included coefficients and progressively re-introducing the non-included attenuated coefficients during multi-scale iterations so that a mismatch reduced at first iterations when only large-scale coefficients are included is further reduced at subsequent iterations, when the non-included attenuated coefficients are added as fine scale coefficients such that perturbations of the fine scale coefficients are minimized, the non-included attenuated coefficients corresponding to a fine scale.

2. The method of claim 1, further comprising: reconstructing the spatial properties for the ensemble based on the subset of the wavelet coefficients and the non-included attenuated coefficients.

3. The method of claim 1, wherein the multi-scaling iterations are repeated until all the large scale coefficients are used and the non-included attenuated coefficients are progressively re-introduced from iteration to iteration.

4. The method of claim 1, wherein the applying of the ensemble-based optimization method is repeated for each new larger subset.

5. The method of claim 1, wherein the applying of the ensemble-based optimization method comprises:
   calculating a Kalman gain for the ensemble;
   applying a scale adaptive spatial localization to the Kalman gain; and
   applying a wavelet localization to the Kalman gain.

6. The method of claim 1, wherein the data includes at least one of seismic data and flow data associated with the subsurface.

7. The method of claim 1, wherein at least one of the spatial properties of the ensemble is porosity or permeability.

8. The method of claim 1, wherein the realizations are static, including petro-physical fields, and dynamic, including at least one of pressure and saturation evolution.

9. The method of claim 1, wherein the wavelet re-parameterization includes a grid-adaptive second generation wavelet parameterization.

10. The method of claim 1, wherein the ensemble-based optimization method is a Levenberg-Marquardt ensemble randomized maximum likelihood (LM-enRML) method.

11. The method of claim 10, wherein the LM-enRML method calculates a global gradient that is used to simultaneously update the members of the ensemble.

12. The method of claim 1, further comprising:
   matching at least one of history production data and 4D seismic data with the one or more physical parameters of the subsurface.

13. A computing device for generating a multidimensional image of a subsurface of the earth, the computing device comprising:
   an interface configured to receive data related to the subsurface of the earth; and
   a processor connected to the interface and configured to,
   generate an ensemble of realizations associated with the subsurface based on the received data,
   apply wavelet re-parameterization to spatial properties of members of the ensemble to calculate a set of wavelet coefficients that correspond to a large scale,
   reconstruct spatial properties of the ensemble based on a subset of the wavelet coefficients,
   apply a forward simulator to the reconstructed spatial properties of the ensemble for estimating one or more physical parameters of the subsurface,
   apply an ensemble-based optimization method to update the subset of the wavelet coefficients, and
   generate the multidimensional image of the subsurface based on the updated subset of the wavelet coefficients
   wherein the processor is further configured to:
   refine the subset of the wavelet coefficients by adding non-included coefficients that belong to the set but not the subset, and
   attenuate the non-included coefficients and progressively re-introducing the non-included attenuated coefficients during multi-scale iterations so that a mismatch reduced at first iterations when only large scale coefficients are included is further reduced at subsequent iterations, when the non-included attenuated coefficients are added as fine scale coefficients such that perturbations of the fine scale coefficients are minimized, wherein the non-included attenuated coefficients correspond to a fine scale.

14. The computing device of claim 13, wherein the spatial properties of the ensemble are reconstructed based on the subset of the wavelet coefficients and the non-included attenuated coefficients.

15. The computing device of claim 13, wherein the step of multi-scaling iterations are repeated until all the large scale coefficients are used, and the attenuated non-included coefficients are progressively re-introduced from iteration to iteration.

16. A non-transitory computer readable medium including computer executable instructions, wherein the instructions, when executed by a computer, implement a method for generating a multidimensional image of a subsurface of the earth, the method comprising:
   receiving data related to the subsurface of the earth;
   generating an ensemble of realizations associated with the subsurface based on the received data;
   applying wavelet re-parameterization to spatial properties of members of the ensemble to calculate a set of wavelet coefficients;
   reconstructing spatial properties of the ensemble based on a subset of the wavelet coefficients that correspond to a large scale;
   applying a forward simulator to the reconstructed spatial properties of the ensemble for estimating one or more physical parameters of the subsurface;

applying an ensemble-based optimization method to update the subset of the wavelet coefficients; and generating the multidimensional image of the subsurface based on the updated subset of the wavelet coefficients wherein the method further comprises:

refining the subset of the wavelet coefficients by adding non-included coefficients that belong to the set but not the subset, and attenuating the non-included coefficients and progressively re-introducing the non-included attenuated coefficients during multi-scale iterations so that a mismatch reduced at first iterations when only large-scale coefficients are included is further reduced at subsequent iterations, when the non-included attenuated coefficients are added as fine scale coefficients such that perturbations of the fine scale coefficients are minimized, the non-included attenuated coefficients corresponding to a fine scale.

* * * * *